(12) United States Patent
Zhao et al.

(10) Patent No.: US 10,204,006 B2
(45) Date of Patent: *Feb. 12, 2019

(54) SYSTEMS AND METHODS FOR SIDE DATA BASED SOFT DATA FLASH MEMORY ACCESS

(71) Applicant: Avago Technologies International Sales Pte. Limited, Singapore (SG)

(72) Inventors: Zhijun Zhao, Fremont, CA (US); Shaohua Yang, San Jose, CA (US)

(73) Assignee: AVAGO TECHNOLOGIES INTERNATIONAL SALES PTE. LIMITED, Singapore (SG)

( * ) Notice: Subject to any disclaimer, the term of this patent is extended or adjusted under 35 U.S.C. 154(b) by 86 days.

This patent is subject to a terminal disclaimer.

(21) Appl. No.: 14/925,755

(22) Filed: Oct. 28, 2015

(65) Prior Publication Data

US 2017/0123901 A1 May 4, 2017

(51) Int. Cl.
| | |
|---|---|
| *G06F 11/10* | (2006.01) |
| *G11C 16/26* | (2006.01) |
| *G06F 12/16* | (2006.01) |
| *G11C 29/52* | (2006.01) |
| *H03M 13/11* | (2006.01) |
| *G11C 16/08* | (2006.01) |
| *G11C 16/10* | (2006.01) |
| *G11C 7/10* | (2006.01) |
| *G11C 11/56* | (2006.01) |
| *G11C 29/04* | (2006.01) |

(52) U.S. Cl.
CPC ........ *G06F 11/1068* (2013.01); *G11C 7/1006* (2013.01); *G11C 11/5628* (2013.01); *G11C 11/5642* (2013.01); *G11C 16/08* (2013.01); *G11C 16/10* (2013.01); *G11C 16/26* (2013.01); *G11C 29/52* (2013.01); *H03M 13/1102* (2013.01); *G11C 2029/0411* (2013.01)

(58) Field of Classification Search
CPC ............. G06F 11/1068; G06F 11/1072; G06F 3/0683; G11C 7/1006; G11C 11/5628; G11C 11/5642; G11C 16/08; G11C 16/10; G11C 16/26; G11C 29/52; G11C 2029/0411; H03M 13/1102; H03M 13/1111; H03M 13/2906; H03M 13/2957; H03M 13/29
See application file for complete search history.

(56) References Cited

U.S. PATENT DOCUMENTS

| | | | |
|---|---|---|---|
| 8,014,196 B2 | 9/2011 | Graef | |
| 8,065,583 B2 | 11/2011 | Radke | |
| 8,406,048 B2 * | 3/2013 | Yang | .................. G11C 11/5642 365/185.02 |
| 8,443,267 B2 | 5/2013 | Zhong et al. | |
| 8,694,854 B1 | 4/2014 | Dar et al. | |

(Continued)

OTHER PUBLICATIONS

U.S. Appl. No. 14/925,688, filed Oct. 28, 2015, Karabed.

(Continued)

*Primary Examiner* — Phung M Chung
(74) *Attorney, Agent, or Firm* — Sheridan Ross P.C.

(57) ABSTRACT

Embodiments are related to systems and methods for data storage, and more particularly to systems and methods for storing and accessing data from a flash memory.

20 Claims, 8 Drawing Sheets

(56) References Cited

U.S. PATENT DOCUMENTS

| | | | |
|---|---|---|---|
| 8,867,268 B2* | 10/2014 | Yang | G11C 11/5642 |
| | | | 365/185.02 |
| 8,947,929 B1 | 2/2015 | Yang | |
| 9,037,431 B2* | 5/2015 | Lee | G11C 11/5628 |
| | | | 702/69 |
| 9,106,264 B2 | 8/2015 | Alhussien et al. | |
| 9,124,300 B2 | 9/2015 | Sharon et al. | |
| 9,214,965 B2 | 12/2015 | Fitzpatrick et al. | |
| 9,286,155 B1 | 3/2016 | Low | |
| 9,337,866 B2 | 5/2016 | Gasanov et al. | |
| 9,450,610 B1 | 9/2016 | Micheloni et al. | |
| 2007/0044006 A1 | 2/2007 | Yang et al. | |
| 2008/0151621 A1* | 6/2008 | Kong | G11C 11/5628 |
| | | | 365/185.03 |
| 2008/0288849 A1 | 11/2008 | Park et al. | |
| 2009/0234792 A1 | 9/2009 | Kim et al. | |
| 2009/0248952 A1 | 10/2009 | Radke et al. | |
| 2010/0034018 A1* | 2/2010 | Yang | G11C 11/5642 |
| | | | 365/185.2 |
| 2010/0165730 A1* | 7/2010 | Sommer | G06F 11/1068 |
| | | | 365/185.03 |
| 2011/0167305 A1 | 7/2011 | Haratsch et al. | |
| 2011/0246855 A1 | 10/2011 | Cheng et al. | |
| 2012/0079351 A1 | 3/2012 | Cideciyan et al. | |
| 2013/0024605 A1 | 1/2013 | Sharon et al. | |
| 2013/0073798 A1 | 3/2013 | Kang et al. | |
| 2013/0182503 A1 | 7/2013 | Liu | |
| 2014/0208189 A1* | 7/2014 | Parthasarathy | H03M 13/13 |
| | | | 714/780 |
| 2014/0281800 A1 | 9/2014 | Micheloni et al. | |
| 2015/0243351 A1 | 8/2015 | Moschiano et al. | |
| 2015/0256291 A1 | 9/2015 | Shin et al. | |
| 2016/0173228 A1 | 6/2016 | Shin et al. | |
| 2016/0218740 A1 | 7/2016 | Parthasarathy et al. | |
| 2016/0285663 A1 | 9/2016 | Choi et al. | |
| 2017/0046220 A1 | 2/2017 | Sharon et al. | |
| 2017/0123899 A1* | 5/2017 | Zhao | G06F 11/1068 |
| 2017/0123900 A1* | 5/2017 | Zhao | G06F 11/1068 |
| 2017/0123901 A1* | 5/2017 | Zhao | G06F 11/1068 |

OTHER PUBLICATIONS

U.S. Appl. No. 14/925,714, filed Oct. 28, 2015, Zhao.
Official Action for U.S. Appl. No. 14/925,688, dated Jun. 29, 2017 13 pages.
Official Action for U.S. Appl. No. 14/925,688, dated Jan. 11, 2018.
Official Action for U.S. Appl. No. 14/925,714, dated Jun. 6, 2017 19 pages.
Official Action for U.S. Appl. No. 14/9225,714, dated Nov. 17, 2017 21 pages.
Notice of Allowance for U.S. Appl. No. 14/925,726, dated Apr. 18, 2017 9 pages.

* cited by examiner

SYSTEMS AND METHODS FOR SIDE DATA BASED SOFT DATA FLASH MEMORY ACCESS

FIELD OF THE INVENTION

Embodiments are related to systems and methods for data storage, and more particularly to systems and methods for storing and accessing data from a flash memory.

BACKGROUND

To increase density in a flash memory device, multi-level cells are used. Such multi-level cells may be, for example, programmed to with one of four voltage levels with each of the four voltage levels representing a two bit binary value. When reading such a multi-level cell, a read back voltage is compared with a center voltage threshold to determine one bit of the two bit value and a second comparison is performed with either an upper voltage threshold or a lower voltage threshold to determine the other bit of the two bit value. Use of multiple comparisons to yield the two bit binary value results in considerable latency.

Hence, for at least the aforementioned reasons, there exists a need in the art for advanced systems and methods for storing and accessing data to/from a flash memory.

SUMMARY

Embodiments are related to systems and methods for data storage, and more particularly to systems and methods for storing and accessing data from a flash memory.

This summary provides only a general outline of some embodiments of the invention. The phrases "in one embodiment," "according to one embodiment," "in various embodiments", "in one or more embodiments", "in particular embodiments" and the like generally mean the particular feature, structure, or characteristic following the phrase is included in at least one embodiment or one embodiment of the present invention, and may be included in more than one embodiment of the present invention. Importantly, such phrases do not necessarily refer to the same embodiment. Many other embodiments of the invention will become more fully apparent from the following detailed description, the appended claims and the accompanying drawings.

BRIEF DESCRIPTION OF THE FIGURES

A further understanding of the various embodiments of the present invention may be realized by reference to the figures which are described in remaining portions of the specification. In the figures, like reference numerals are used throughout several figures to refer to similar components. In some instances, a sub-label consisting of a lower case letter is associated with a reference numeral to denote one of multiple similar components. When reference is made to a reference numeral without specification to an existing sub-label, it is intended to refer to all such multiple similar components.

DETAILED DESCRIPTION OF SOME EMBODIMENTS

Figure 1:
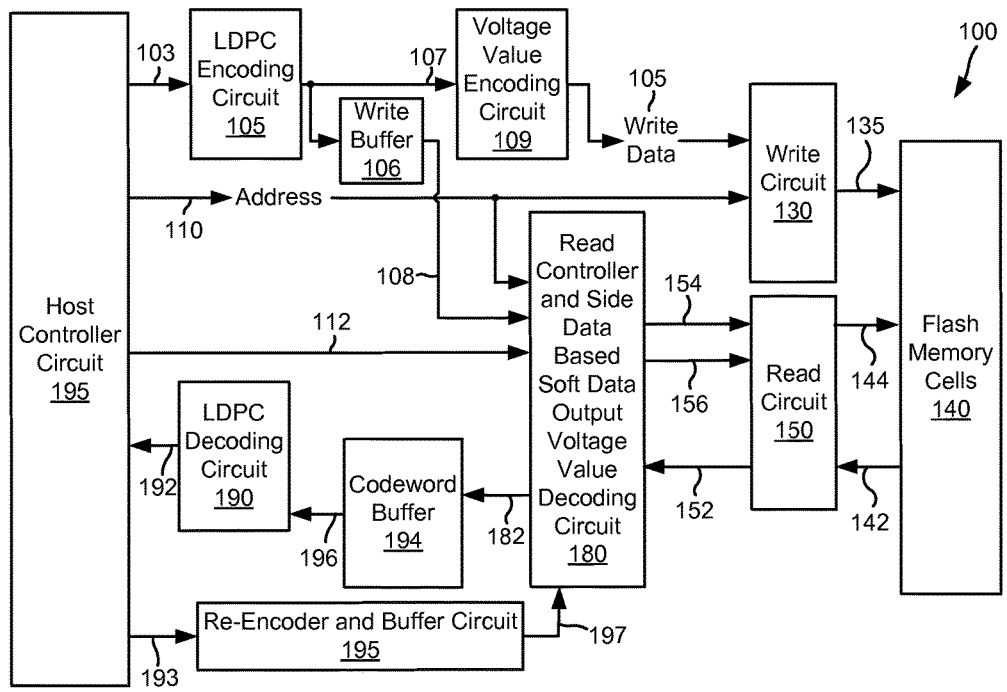
FIG. 1 shows a solid state storage system including side data based soft data output voltage value decoding circuitry in accordance with some embodiments of the present invention.

Embodiments are related to systems and methods for data storage, and more particularly to systems and methods for storing and accessing data from a flash memory.

Various embodiments provide methods for accessing a solid state memory device. The methods include: accessing a set of M groups of N flash memory cells to yield M sets of N voltages where M and N are integers; comparing the M sets of N voltages with a first threshold value to yield a first group of M sets of N binary outputs; comparing the M sets of N voltages with a second threshold value to yield a second group of M sets of N binary outputs; generating a side data set corresponding to at least one of the first set of M groups of N binary values, the second set of M groups of N binary values, and the third set of M groups of N binary values; and using a first data decoding circuit to generate: a first set of M soft data values each corresponding to a combination of a respective one of the M sets of N binary outputs in the first group of M sets of N binary outputs and a corresponding element of the side data set; a second set of M soft data values each corresponding to a combination of a respective one of the M sets of N binary outputs in the second group of M sets of N binary outputs and a corresponding element of the side data set; and a third set of M soft data values each corresponding to a combination of a respective one of the M sets of N binary outputs in the second group of M sets of N binary outputs and a corresponding element of the side data set.

In some instances of the aforementioned embodiments, generating the side data set includes encoding a user data set to yield a low density parity check codeword prior to writing the M groups of N flash memory cells. In various instances of the aforementioned embodiments, the first set of M soft data values corresponds to a first low density parity check codeword, the second set of M soft data values corresponds to a second low density parity check codeword, and the third set of M soft data values corresponds to a third low density parity check codeword, and wherein the second data decoding circuit is a low density parity check decoding circuit. In some such instances, generating the side data set includes resolving the first set of M soft data values to yield corresponding hard data values.

In one or more instances of the aforementioned embodiments, the methods further include: using a second data decoding circuit to decode the first set of M soft data values to yield a first decoded output; decode the second set of M soft data values to yield a second decoded output; and decode the third set of M soft data values to yield a third decoded output. In some instances, the method further includes comparing the M sets of N voltages with a third threshold value to yield a third group of M sets of N binary outputs; and using the first data decoding circuit to generate a fourth set of M soft data values each corresponding to a combination of a respective one of the M sets of N binary outputs in the third group of M sets of N binary outputs and the corresponding element of the side data set; and a fifth set of M soft data values each corresponding to a combination of a respective one of the M sets of N binary outputs in the third group of M sets of N binary outputs and the corresponding element of the side data set.

Other embodiments of the present invention provide systems for accessing a flash memory device. Such systems include a data read circuit, a storage buffer, a first data decoding circuit, and a second data decoding circuit. The data read circuit is operable to: compare voltages read from a set of M groups of N flash memory cells with a first threshold value to yield a first binary output set, where the first binary output set includes a first set of M groups of N binary values, and M and N are integers; and compare voltages read from the set of M groups of N flash memory cells with a second threshold value to yield a second binary output set, where the second binary output set includes a second set of M groups of N binary values and a third set of M groups of N binary values. The storage buffer is operable to store a side data set corresponding to at least one of the first set of M groups of N binary values, the second set of M groups of N binary values, and the third set of M groups of N binary values. The first data decoding circuit is operable to generate at least a first set of M soft data values each corresponding to a combination of a respective one of the second set of M groups of N binary values and a corresponding element from the side data set. The second data decoding circuit operable to decode the first set of M soft data values to yield a data output. In some cases N is three and M is the number of elements in a codeword. In some particular cases, M is 4K. In other particular cases, M is 16K. In various cases, the system is implemented as part of an integrated circuit.

In some instances of the aforementioned embodiments, the side data set is a low density parity check codeword generated prior to writing the M groups of N flash memory cells. In various instances, the first set of M soft data values corresponds to a first low density parity check codeword, the second set of M soft data values corresponds to a second low density parity check codeword, and the third set of M soft data values corresponds to a third low density parity check codeword, and wherein the second data decoding circuit is a low density parity check decoding circuit. In some such instances, the side data set is a low density parity check codeword generated from data accessed from the M groups of N flash memory cells.

In one or more instances of the aforementioned embodiments, the data output is a first data output, and the second data decoding circuit is further operable to: decode the second set of M soft data values to yield a second data output, and decode the third set of M soft data values to yield a third data output. In particular instances the first data decoding circuit is further operable to generate at least a fourth set of M soft data values each corresponding to a respective one of the M groups of N binary values based upon the second binary output set, and a fifth set of M soft data values each corresponding to a respective one of the M groups of N binary values based upon the second binary output set. In some such instances, the fourth set of M soft data values corresponds to a fourth low density parity check codeword, and the fifth set of M soft data values corresponds to a fifth low density parity check codeword.

In some cases, the first data decoding circuit includes: a first look-up table including soft data values corresponding to a combination of the first binary output set and an element of the side data set that corresponds to the first binary output set; a second look-up table including soft data values corresponding to a combination of the second binary output set and the element of the side data set that corresponds to the first binary output set; and a third look-up table including soft data values corresponding to a combination of the third binary output set and the element of the side data set that corresponds to the first binary output set.

Turning to FIG. 1, a solid state storage system 100 is shown that includes side data based soft data output voltage value decoding circuitry in accordance with some embodiments of the present invention. Solid state storage system 100 includes a host controller circuit 195, a low density parity check encoding circuit 105, a write buffer 106, a voltage value encoding circuit 109, a write circuit 130, flash memory cells 140, a read circuit 150, a read controller and soft data output voltage value decoding circuit 180, a codeword buffer 194, and a low density parity check decoding circuit 190. Host controller circuit 195 directs read and write access to flash memory cells 140. Flash memory cells 140 may be NAND flash memory cells or another type of solid state memory cells as are known in the art.

A data write is effectuated when host controller circuit 195 provides input data 103 to low density parity check encoding circuit 105. Low density parity check encoding circuit 105 applies a low density parity check encoding algorithm to input data 103 to yield LDPC codewords 107. LDPC codewords 107 are stored to a write buffer 106 where they are maintained until overwritten. The stored LDPC codewords 108 are provided to read controller and soft data output voltage value decoding circuit 180 where if the data is still current it can be used as side data in relation to generating soft data.

In addition, LDPC codewords 107 are provided to voltage value encoding circuit 109. Voltage value encoding circuit 109 applies multi-level cell encoding to a group of LDPC codewords 107 to yield write data 105. In some embodiments of the present invention, five LDPC codewords are encoded together to yield write data 105 that is directed to flash memory cells 140 that are written as two-bit cells. It should be noted that while the various embodiments are discussed in relation to using a low density parity check encoding/decoding algorithm, that other encoding/decoding algorithms known in the art may be used in accordance with other embodiments of the present invention.

Figure 2:
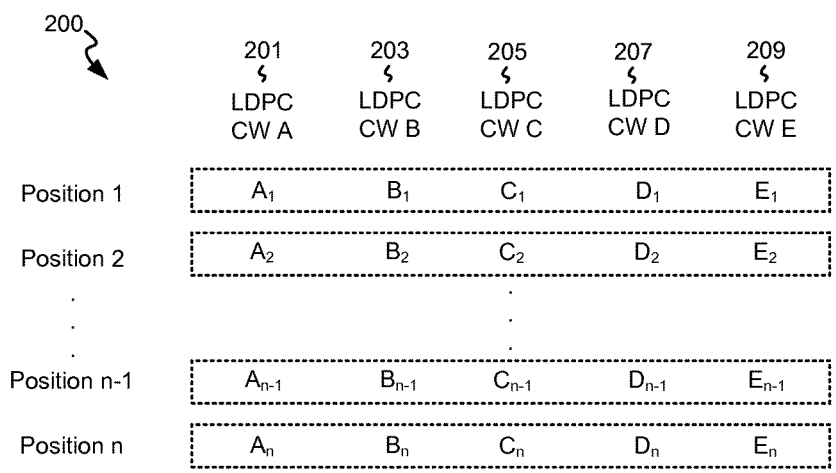
FIG. 2 shows an example of multi-level cell encoding using multiple low density parity check codewords in accordance with some embodiments of the present invention.

Turning to FIG. 2, an example of multi-level cell encoding 200 using multiple low density parity check codewords 201, 203, 205, 207, 209 to yield a series of five bit words that are encoded into write data in accordance with some embodiments of the present invention. Each of the low density parity check codewords 201, 203, 205, 207, 209 includes a number of bits indicated as positions (i.e., position 1, position 2, ... position n−1, and position n). It should be noted that an element (e.g., bit) of each of the respective codewords is found at each position. In some cases the element may be a filler value or an element from another codeword where a given codeword is shorter than another codeword. Thus, at position 1 a five bit word includes the first element of each of the five low density parity check codewords 201, 203, 205, 207, 209 (i.e., {$A_1$, $B_1$, $C_1$, $D_1$, $E_1$}). This is repeated for each of the positions 1 through n to yield n five bit words (i.e., {$A_2$, $B_2$, $C_2$, $D_2$, $E_2$} ... {$A_n$, $B_n$, $C_n$, $D_n$, $E_n$}).

Figure 3:
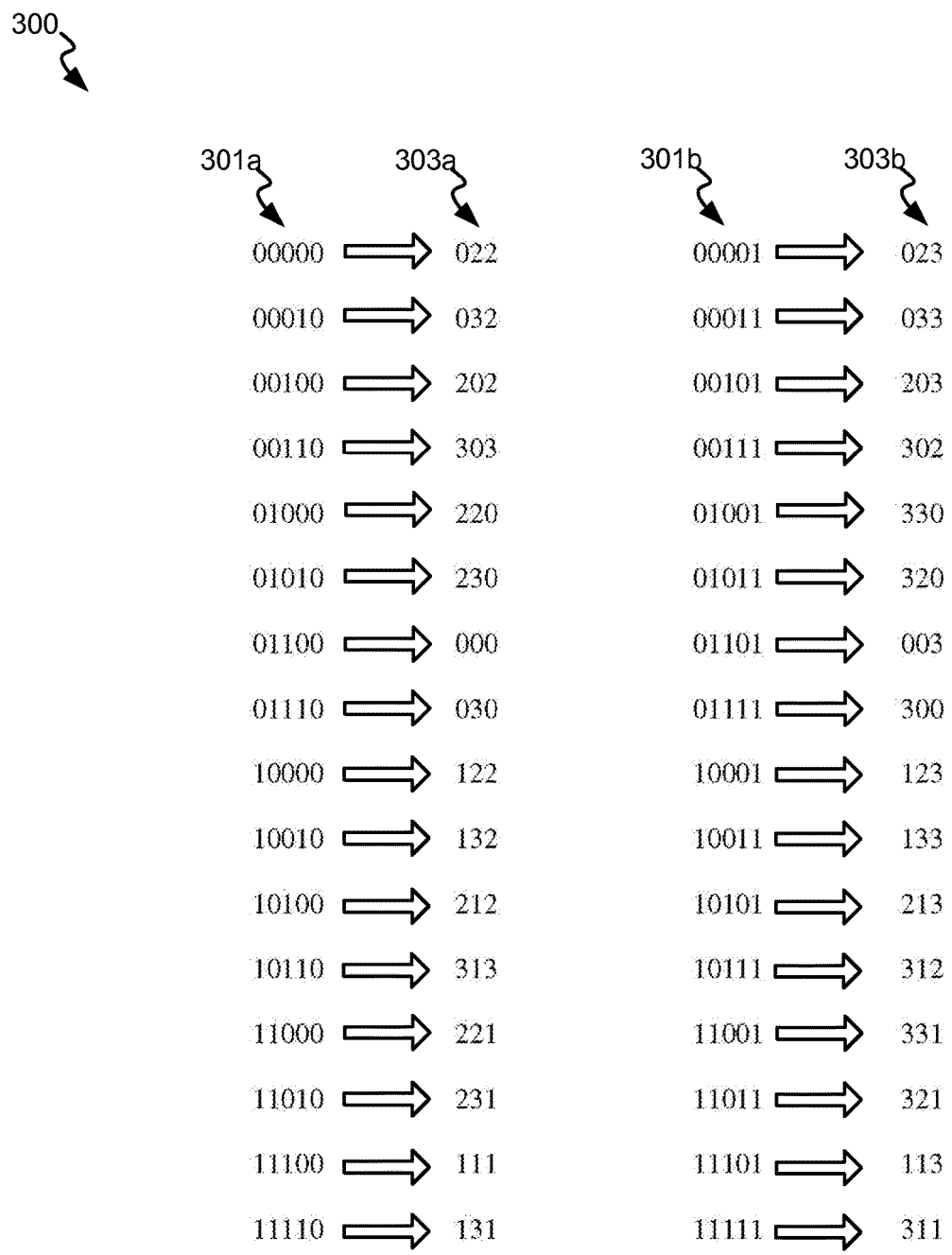
FIG. 3 shows a five bit word to three voltage levels conversion table in accordance with some embodiments of the present invention.
Figure 4A:
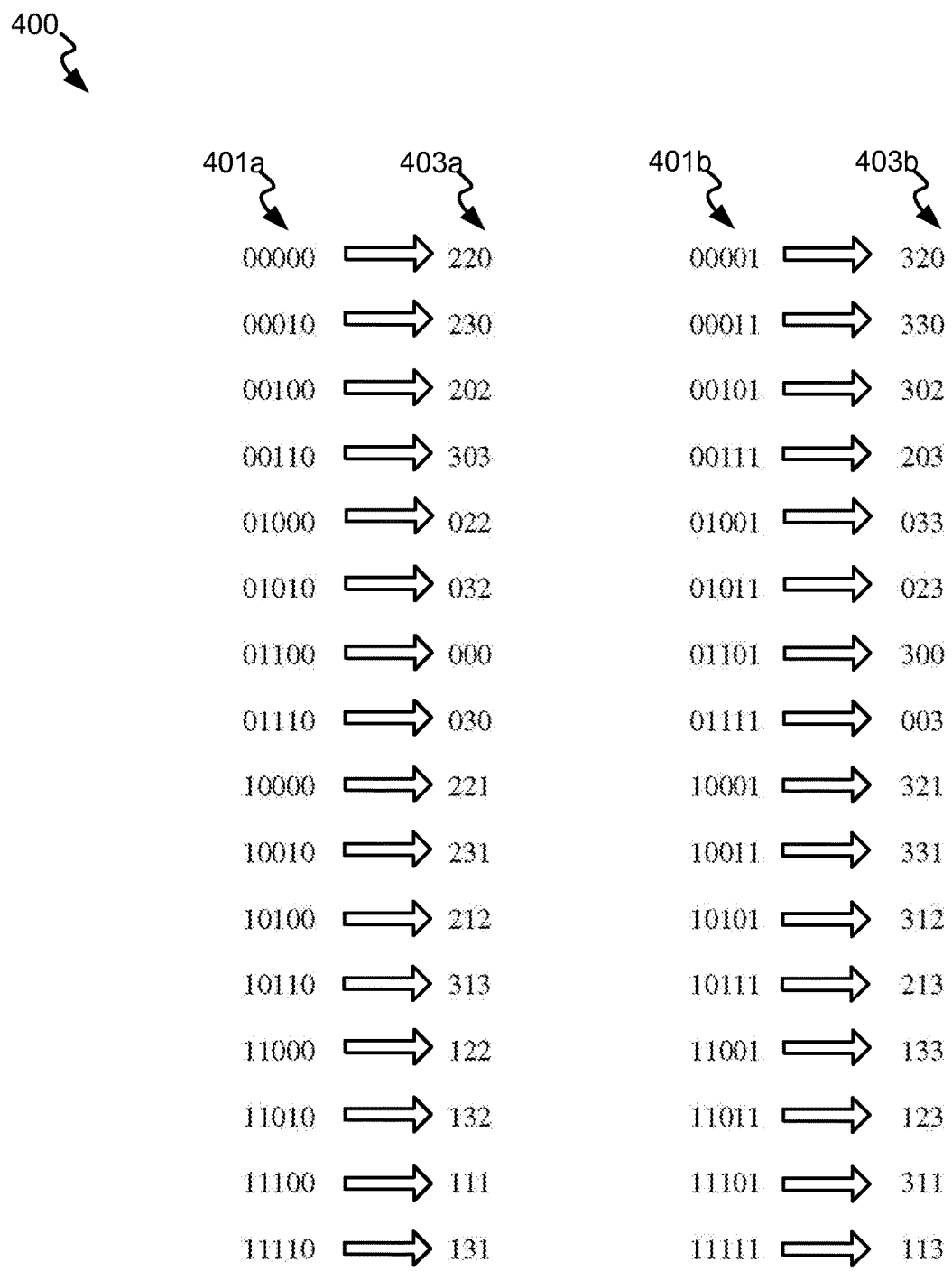
FIG. 4a shows another five bit word to three voltage levels conversion table in accordance with some embodiments of the present invention.

Returning to FIG. 1, voltage value encoding circuit 109 encodes each of the n five bit words discussed in relation to FIG. 2 to a corresponding three value output that is provided as write data 105. Turning to FIG. 3, a five bit word 301a, 301b ({A, B, C, D, E}) to three voltage levels 303a, 303b ({X, Y, Z}) conversion table 300 is shown in accordance with some embodiments of the present invention. As shown, five bit word 301a, 301b correspond to the five bit words ({A, B, C, D, E}) discussed above in relation to FIG. 2. Thus, for example, where the five bit word is '00000' the corresponding three voltage levels ({X, Y, Z}) are "0, 2, 2". Similarly, where three voltage levels are "3, 1, 2" the corresponding five bit word is '10111'. Turning to FIG. 4a, another five bit word 401a, 401b ({A, B, C, D, E}) to three voltage levels 403a, 403b ({X, Y, Z}) conversion table 400 in accordance with some embodiments of the present invention. As shown, five bit word 401a, 401b correspond to the five bit words ({A, B, C, D, E}) discussed above in relation to FIG. 2. Thus, for example, where the five bit word is '00000' the corresponding three voltage levels ({X, Y, Z}) are "2, 2, 0". Similarly, where three voltage levels are "3, 1, 2" the corresponding five bit word is '10101'. It should be noted that while the aforementioned conversion tables are from five bit words to three voltage levels, other conversions may be possible in accordance with various embodiments of the present invention. For example, other embodiments of the present invention may use conversion tables from four bit words to three voltage levels. Based upon the disclosure provided herein, one of ordinary skill in the art will recognize other conversion tables that may be used in accordance with various embodiments of the present invention.

Returning to FIG. 1, write data 105 is provided to a write circuit 130. In addition, write circuit 130 receives an address 110 is received from host controller circuit 195. Write circuit 130 converts the voltage levels (e.g., {X, Y, Z}) received as write data 105 into a series of voltages 135 that are written to three cells of flash memory cells 140 indicated by address 110. Thus, for example, in the case where each cell of flash memory cells 140 are written as two bit cells, a voltage level of "0" (i.e., for a value of X, Y or Z equal to zero) results in voltage 135 being set below a lower threshold ($V_L$), a voltage level of "1" (i.e., for a value of X, Y or Z equal to one) results in voltage 135 being set above the lower threshold ($V_L$) and below a center threshold ($V_C$), a voltage level of "2" (i.e., for a value of X, Y or Z equal to two) results in voltage 135 being set above the center threshold ($V_C$) and below an upper threshold ($V_U$), and a voltage level of "3" (i.e., for a value of X, Y or Z equal to three) results in voltage 135 being set above the upper threshold ($V_U$). This process results in storing three voltage values respectively to three cells within flash memory cells to represent a five bit word. This process is repeated for each of the five bit words resulting in a group of multiple sets of three flash memory cells representing the five LDPC codewords received as LDPC codewords 107.

A data read is effectuated when host controller circuit 195 provides a read request indication 112 and address 110 to read controller and side data based soft data output voltage value decoding circuit 180. Read controller and side data based soft data output voltage value decoding circuit 180 translates read request 112 and address 110 into an address 154 and a threshold value 156 (or series of threshold values) that are provided to a read circuit 150. A read location 144 is generated based upon address 154 and provided to flash memory cells 140. In response, flash memory cells 140 provides return voltages 142 stored at the cells indicated by read location 144. Read circuit 150 compares return voltages 142 with threshold 156 to yield corresponding binary values 152.

Figure 4B:
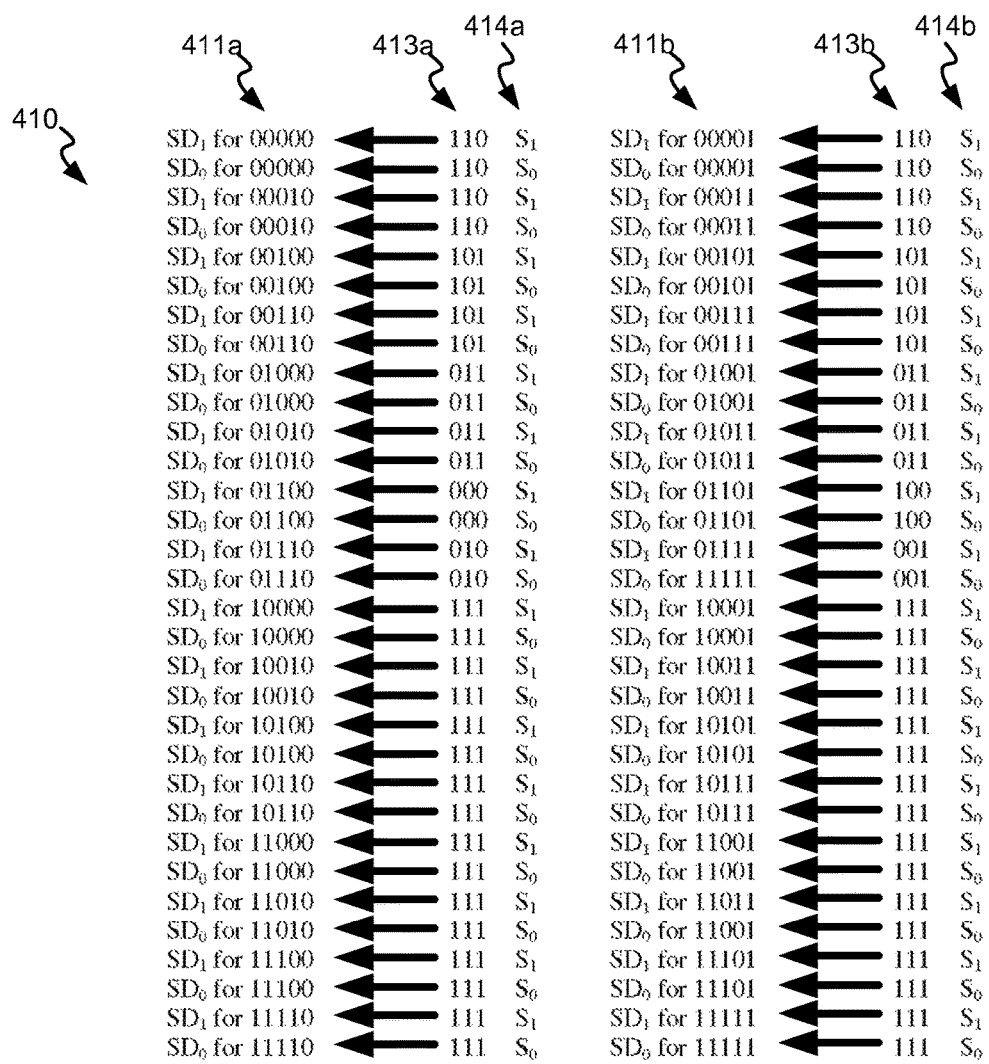
FIGS. 4b-4d show page by page voltage level to corresponding bit(s) of the five bit word conversion in accordance with various embodiments of the present invention.

Turning to FIG. 4b, a first part of the aforementioned process of comparing return voltages 142 with threshold 156 is shown where the conversion of FIG. 4a was used in the original encoding. This first part recovers a soft data representation of the first LDPC codeword (i.e., low density parity check codeword 201) based upon a combination of return voltages 142 and a side data value 414a, 414b. As shown, a table 410 represents conversion of the three voltage levels 403a, 403b ({X, Y, Z}) of FIG. 4a along with a side data value 414a, 414b where threshold 156 is the lower threshold ($V_L$). By comparing with $V_L$, any voltage value received as return voltages 142 that is less than $V_L$ (e.g., the voltage level of "0" discussed above) results in a binary '0', while any voltage value received as return voltages 142 that is greater than or equal to $V_L$ (e.g., the voltage levels of "1", "2" or "3" discussed above) results in a binary '1'. Thus, for example, where three cells of flash memory cells 140 return three voltage levels of "2, 2, 0", respectively, the corresponding binary output (i.e., binary values 152) is '110' (shown as values 413a, 413b). As another example, where three cells of flash memory cells 140 return three voltage levels of "3, 1, 2", respectively, the corresponding binary output is '111' (shown as values 413a, 413b). These binary values are added to side data ($S_1$ or $S_0$) where available, and the combination is mapped to a single soft data value corresponding to one LDPC codeword (i.e., low density parity check codeword 201). Said another way, the three bit binary values 413a, 413b along with the corresponding side data 414a, 414b map to soft data for a corresponding five bit word (i.e., SD for XXXX 411a, 411b).

Side data 414a, 414b is accessed from codeword buffer 194 or write buffer 106. In particular, where the flash memory cells have been accessed using the center threshold ($V_C$) resulting in recovery of low density parity check codeword 203 and low density parity check codeword 205, side data 414a, 414b may be a corresponding element from the recovered low density parity check codeword 203 which is adjacent to low density parity check codeword 201 being recovered using the lower threshold ($V_L$). Alternatively, where low density parity check codeword 203 remains in write buffer 106, the corresponding element from write buffer 106 can be accessed and used as side data 414a, 414b. Any corresponding element from an available one of a codeword that is in decoded form may be used as side data 414a, 414b. It should also be noted that while the embodiment is disclosed as using only one side data in addition to three bit binary values 413a, 413b, that other embodiments having access to multiple side bits may use those multiple side bits in addition to three bit binary values 413a, 413b to generate corresponding soft data. Thus, for example, where a corresponding element from low density parity check codeword 203 and a corresponding element from low density parity check 205 exist, both of the corresponding elements may be used in addition to three bit binary values 413a, 413b to generate the soft data value.

The conversion process from three bit binary values 413a, 413b and side data 414a, 414b to the single soft data value corresponding to one LDPC codeword (i.e., low density parity check codeword 201) may be done using a look up table that is loaded with pre-calculated soft data values corresponding to the combination of respective three bit binary values and side data. Alternatively, the soft data values corresponding to the respective three bit binary values and side data may be calculated on the fly based upon the respective three bit binary values. Comparison of the next set of three cells of flash memory cells with $V_L$ is performed to yield the soft data value corresponding to the next bit of the LDPC codeword (i.e., low density parity check codeword 201). This process is repeated until soft data values corresponding to all bits of the LDPC codeword are generated (i.e., low density parity check codeword 201). Where no side information is available, the soft data generated corresponds only to the three bit binary values 413a, 413b.

In some embodiments, the soft data values for any bit of a five bit word corresponding to only the respective three bit binary values 413a, 413b are calculated (either pre-calculated and stored to a look-up table, or calculated on the fly using a calculation circuit) in accordance with the following equation:

$$\text{Soft Data Value} = LLR(Y, p) = \ln\left(\frac{\text{Probability}[b_p = 0 \mid Y]}{\text{Probability}[b_p = 1 \mid Y]}\right),$$

where LLR is a log-likelihood ratio, Y represents the three bit value 413a, 413b derived from flash memory cells 140, p represents the position in the five bit word, and $b_p$ represents the binary value for the bit at position p. The aforementioned equation is derived based upon the following:

$$\text{Probability}(b_p, Y) = \sum_{\{b_i:\ i \neq p\}} \text{Probability}(C(b_0, b_1, \ldots, b_{Np-1}) \mid Y),$$

where C are the three voltages provided from flash memory cells; where:

$$\text{Probability}(C, Y) = \frac{\text{Probability}(Y \mid C)}{\Sigma_{C'} \text{Probability}(Y \mid C')},$$

where $$\text{Probability}(Y, C) = \text{Probability}(Y \mid l(C)) = \prod_{i=0}^{L-1} \text{Probability}(y_i \mid l(c_i))$$

for the case of additive white Gaussian noise:

$$\text{Probability}(y = 0 \mid l) = \frac{1}{2}\left[1 + \text{erf}\left(\frac{t-1}{\sqrt{2\sigma^2}}\right)\right].$$

In various cases, quantized inputs are used in place of the three bit binary values. In such a case, the soft data output corresponding to the quantized inputs is calculated in accordance with the following equation:

$$\text{Soft Data Value} = LLR(U, p) = \ln\left(\frac{\text{Probability}[b_p = 0 \mid U]}{\text{Probability}[b_p = 1 \mid U]}\right),$$

where U represents a quantized version of the three bit value 413a, 413b derived from flash memory cells 140.

The soft data values for any bit of a five bit word corresponding to a combination of the respective three bit binary values 413a, 413b and associated side data value 414a, 414b are calculated (either pre-calculated and stored to a look-up table, or calculated on the fly using a calculation circuit) in accordance with the following equation:

$$\text{Soft Data Value} = LLR(Y, B_s, p) = \ln\left(\frac{\text{Probability}[b_p = 0, B \mid Y]}{\text{Probability}[b_p = 1, B \mid Y]}\right),$$

where LLR is a log-likelihood ratio, Y represents the three bit value 413a, 413b derived from flash memory cells 140, $B_s$ represents the side data value 414a, 414b, p represents the position in the five bit word, and $b_p$ represents the binary value for the bit at position p. The aforementioned equation is derived based upon the following:

$$\text{Probability}(b_p, B_s \mid Y) = \sum_{\{b_i:\ i \neq p,\notin Ps\}} \text{Probability}(C(b_0, b_1, \ldots, b_{Np-1}) \mid Y),$$

where C are the three voltages provided from flash memory cells, and $P_s$ is the grouping of all known side data values 414a, 414b; where:

$$\text{Probability}(C, Y) = \frac{\text{Probability}(Y \mid C)}{\Sigma_{C'} \text{Probability}(Y \mid C')},$$

where $$\text{Probability}(Y, C) = \text{Probability}(Y \mid l(C)) = \prod_{i=0}^{L-1} \text{Probability}(y_i \mid l(c_i))$$

for the case of additive white Gaussian noise:

$$\text{Probability}(y = 0 \mid l) = \frac{1}{2}\left[1 + \text{erf}\left(\frac{t-1}{\sqrt{2\sigma^2}}\right)\right].$$

In various cases, quantized inputs are used in place of the three bit binary values. In such a case, the soft data output corresponding to the quantized inputs is calculated in accordance with the following equation:

$$\text{Soft Data Value} = LLR(U, B_s, p)$$
$$= \ln\left(\frac{\sum_{\{bi: i\neq p, i\notin Ps\}} \text{Probability}\left(C\begin{pmatrix}b_0, b_i, \ldots, b_p = \\ 0, \ldots, b_{Np-1}\end{pmatrix} \mid Y\right)}{\sum_{\{bi: i\neq p, i\notin Ps\}} \text{Probability}\left(C\begin{pmatrix}b_0, b_i, \ldots, b_p = \\ 1, \ldots, b_{Np-1}\end{pmatrix} \mid Y\right)}\right),$$

where U represents a quantized version of the three bit value 413a, 413b derived from flash memory cells 140.

Figure 4C:
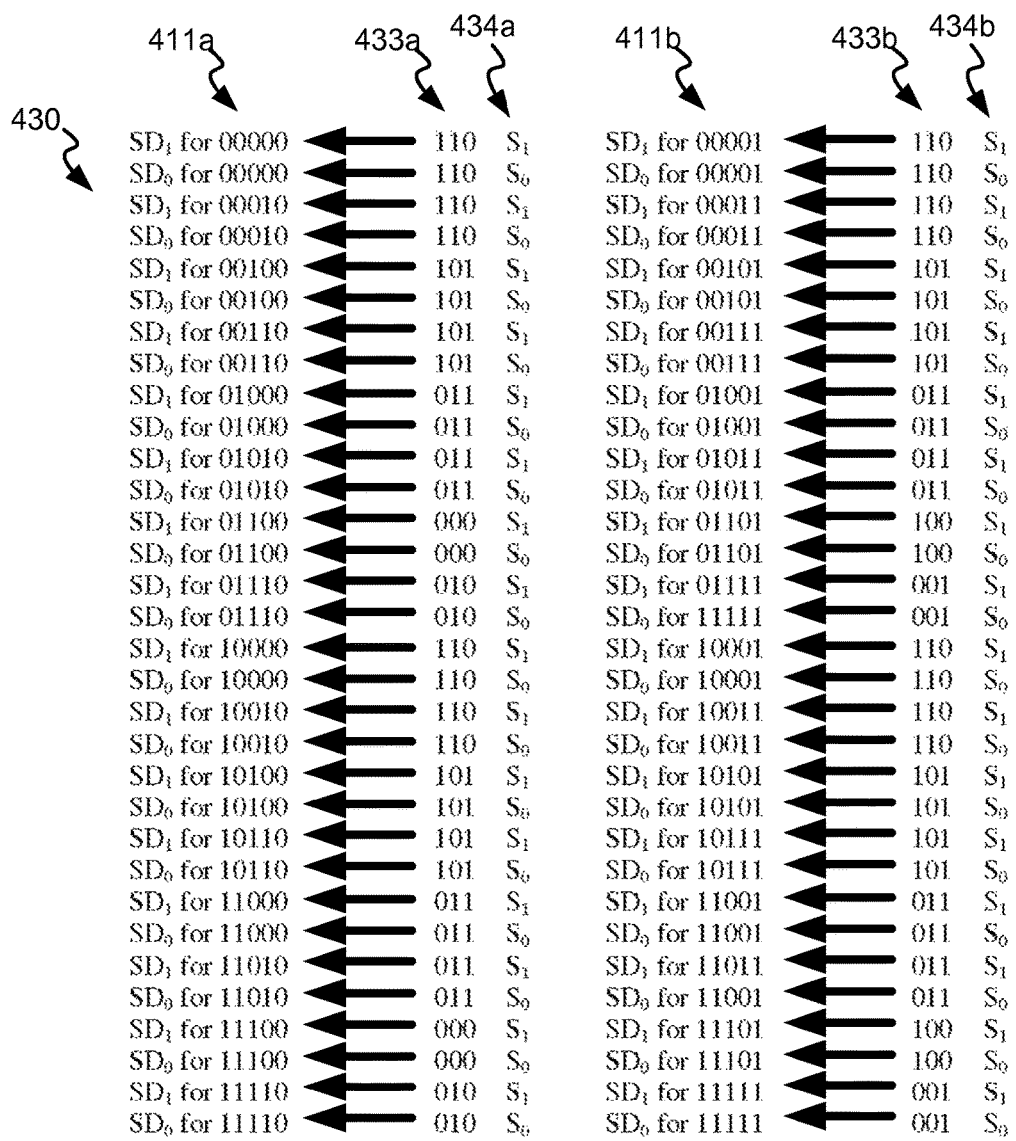

Turning to FIG. 4c, a second part of the aforementioned process of comparing return voltages 142 with threshold 156 is shown where the conversion of FIG. 4a was used in the original encoding. This second part recovers the second and third LDPC codewords (i.e., low density parity check codeword 203 and low density parity check codeword 205) based upon a combination of return voltages 142 and a side data value 414a, 414b. As shown, a table 430 represents conversion of the three voltage levels 403a, 403b ({X, Y, Z}) of FIG. 4a along with a side data value 434a, 434b where threshold 156 is the center threshold ($V_C$). By comparing with $V_C$, any voltage value received as return voltages 142 that is less than $V_C$ (e.g., the voltage levels of "0" or "1" discussed above) results in a binary '0', while any voltage value received as return voltages 142 that is greater than or equal to $V_C$ (e.g., the voltage levels of "2" or "3" discussed above) results in a binary '1'. Thus, for example, where three cells of flash memory cells 140 return three voltage levels of "2, 2, 0", respectively, the corresponding binary output (i.e., binary values 152) is '110' (shown as values 433a, 433b). As another example, where three cells of flash memory cells 140 return three voltage levels of "3, 1, 2", respectively, the corresponding binary output is '101' (shown as values 433a, 433b). These binary values are added to side data ($S_1$ or $S_0$) where available, and the combination is mapped to two soft data values corresponding to two LDPC codewords (i.e., low density parity check codeword 203 and low density parity check codeword 205). Said another way, the three bit binary values 433a, 433b along with the corresponding side data 434a, 434b map to soft data for a corresponding five bit word (i.e., SD for XXXX 411a, 411b).

Side data 434a, 434b is accessed from codeword buffer 194 or write buffer 106. In particular, where the flash memory cells have been accessed using the lower threshold ($V_L$) resulting in recovery of low density parity check codeword 201, side data 434a, 434b may be a corresponding element from the recovered low density parity check codeword 201 which is adjacent to low density parity check codeword 203 being recovered using the center threshold ($V_C$). Alternatively, where low density parity check codeword 201 remains in write buffer 106, the corresponding element from write buffer 106 can be accessed and used as side data 434a, 434b. Any corresponding element from an available one of a codeword that is in decoded form may be used as side data 434a, 434b. It should also be noted that while the embodiment is disclosed as using only one side data in addition to three bit binary values 433a, 433b, that other embodiments having access to multiple side bits may use those multiple side bits in addition to three bit binary values 433a, 433b to generate corresponding soft data. Thus, for example, where a corresponding element from low density parity check codeword 207 and a corresponding element from low density parity check 209 exist, both of the corresponding elements may be used in addition to three bit binary values 433a, 433b to generate the soft data value.

The conversion process from three bit binary values 433a, 433b and side data 434a, 434b to the two soft data values corresponding to respective LDPC codewords (i.e., low density parity check codeword 203, and low density parity check codeword 205) may be done using a look up table that is loaded with pre-calculated soft data values corresponding to the combination of respective three bit binary values and side data. Alternatively, the soft data values corresponding to the respective three bit binary values and side data may be calculated on the fly based upon the respective three bit binary values. Comparison of the next set of three cells of flash memory cells with $V_C$ is performed to yield the soft data value corresponding to the next bit of the LDPC codewords (i.e., low density parity check codeword 203, and low density parity check codeword 205). This process is repeated until soft data values corresponding to all bits of the LDPC codewords are generated (i.e., i.e., low density parity check codeword 203, and low density parity check codeword 205). Where no side information is available, the soft data generated corresponds only to the three bit binary values 433a, 433b. The conversion may be done in accordance with the equations discussed above in relation to FIG. 4b.

Figure 4D:
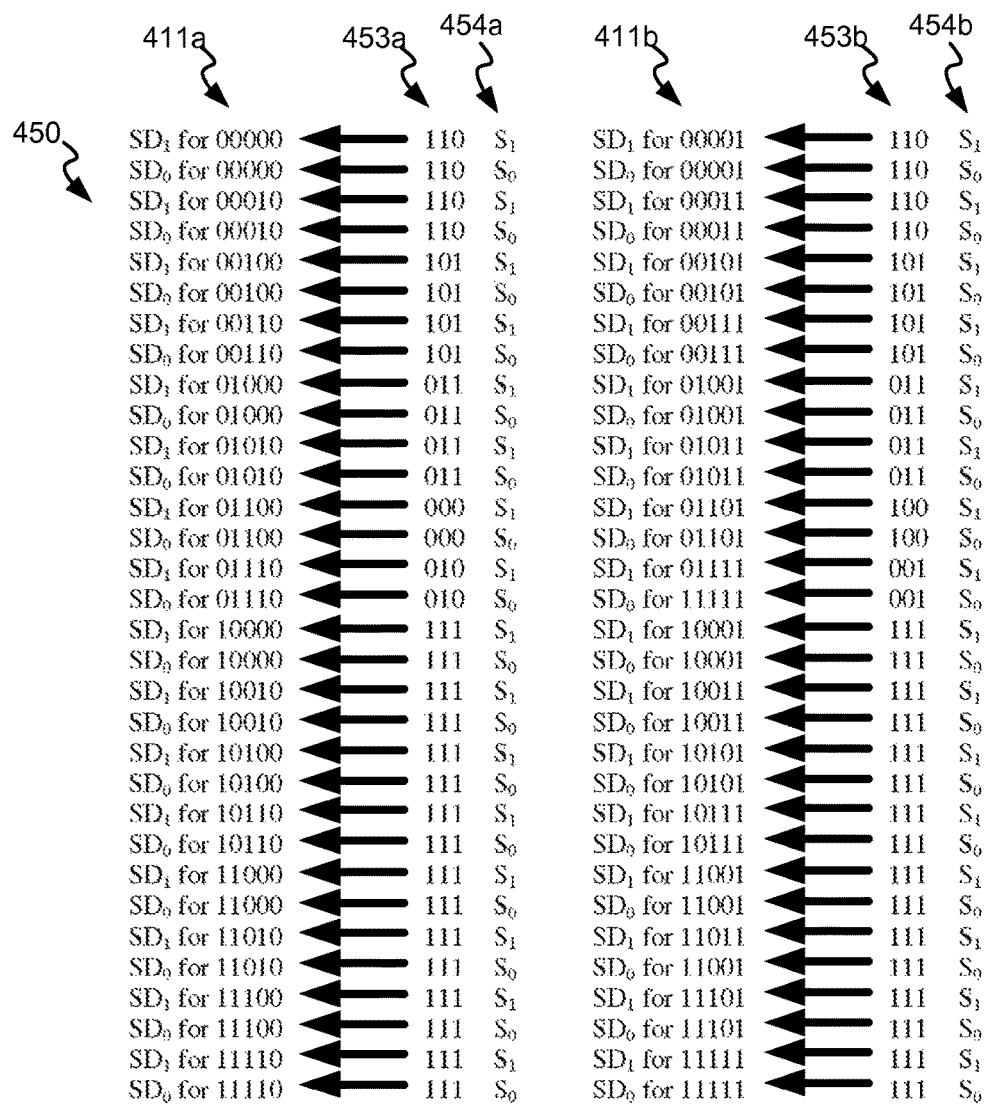

Turning to FIG. 4d, a third part of the aforementioned process of comparing return voltages 142 with threshold 156 is shown where the conversion of FIG. 4a was used in the original encoding. This third part recovers the fourth and fifth LDPC codewords (i.e., low density parity check codeword 207 and low density parity check codeword 209). As shown, a table 430 represents conversion of the three voltage levels 403a, 403b ({X, Y, Z}) of FIG. 4a where threshold 156 is the upper threshold ($V_U$). By comparing with $V_U$, any voltage value received as return voltages 142 that is less than $V_U$ (e.g., the voltage levels of "0" or "1" discussed above) results in a binary '0', while any voltage value received as return voltages 142 that is greater than or equal to $V_U$ (e.g., the voltage levels of "2" or "3" discussed above) results in a binary '1'. Thus, for example, where three cells of flash memory cells 140 return three voltage levels of "2, 2, 0", respectively, the corresponding binary output (i.e., binary values 152) is '110' (shown as values 453a, 453b). As another example, where three cells of flash memory cells 140 return three voltage levels of "3, 1, 2", respectively, the corresponding binary output is '101' (shown as values 453a, 453b). These binary values are added to side data ($S_1$ or $S_0$) where available, and the combination is mapped to two soft data values corresponding to two LDPC codewords (i.e., low density parity check codeword 207 and low density parity check codeword 209). Said another way, the three bit binary values 453a, 453b along with the corresponding side data 454a, 454b map to soft data for a corresponding five bit word (i.e., SD for XXXX 411a, 411b).

Side data 454a, 454b is accessed from codeword buffer 194 or write buffer 106. In particular, where the flash memory cells have been accessed using the center threshold ($V_C$) resulting in recovery of low density parity check codeword 203 and low density parity check codeword 205, side data 454a, 454b may be a corresponding element from the recovered low density parity check codeword 205 which is adjacent to low density parity check codeword 207 being recovered using the upper threshold ($V_U$). Alternatively, where low density parity check codeword 205 remains in write buffer 106, the corresponding element from write buffer 106 can be accessed and used as side data 454a, 454b. Any corresponding element from an available one of a codeword that is in decoded form may be used as side data 454a, 454b. It should also be noted that while the embodiment is disclosed as using only one side data in addition to three bit binary values 453a, 453b, that other embodiments having access to multiple side bits may use those multiple side bits in addition to three bit binary values 453a, 453b to generate corresponding soft data. Thus, for example, where a corresponding element from low density parity check codeword 203 and a corresponding element from low density parity check 205 exist, both of the corresponding elements may be used in addition to three bit binary values 453a, 453b to generate the soft data value.

The conversion process from three bit binary values 453a, 453b and side data 454a, 454b to the two soft data values corresponding to respective LDPC codewords (i.e., low density parity check codeword 207, and low density parity check codeword 209) may be done using a look up table that is loaded with pre-calculated soft data values corresponding to the combination of respective three bit binary values and side data. Alternatively, the soft data values corresponding to the respective three bit binary values and side data may be calculated on the fly based upon the respective three bit binary values. Comparison of the next set of three cells of flash memory cells with $V_C$ is performed to yield the soft data value corresponding to the next bit of the LDPC codewords (i.e., low density parity check codeword 207, and low density parity check codeword 209). This process is repeated until soft data values corresponding to all bits of the LDPC codewords are generated (i.e., i.e., low density parity check codeword 207, and low density parity check codeword 209). Where no side information is available, the soft data generated corresponds only to the three bit binary values 453a, 453b. The conversion may be done in accordance with the equations discussed above in relation to FIG. 4b.

Binary values 152 are provided to read controller and side data based soft data output voltage value decoding circuit 180 along with side data (either stored LDPC codewords 108 or a re-encoded side data 197) where they are decoded to yield soft data 182 corresponding to the underlying LDPC codewords (i.e., soft data representation of the originally encoded LDPC codewords 107). Soft data 182 corresponding to the underlying LDPC codewords is provided to codeword buffer 194. Buffered soft data 196 from codeword buffer 194 is provided to low density parity check decoding circuit 190. Low density parity check decoding circuit 190 applies a low density parity check decoding algorithm to soft data 196 to yield recovered read data 192 that is provided to host controller circuit 195. Host controller 195 stores the read data 192 to a data buffer (not shown). Where read data 192 corresponds to decoding data (i.e., is side data), it is provided as feedback data 193 to a re-encoder and buffer circuit 195. Re-encoder and buffer circuit 195 applies the same LDPC encoding algorithm applied by LDPC encoding circuit 105, and the resulting encoded data is buffered. The buffered data is then provided as re-encoded side data 197 to read controller and side data based soft data output voltage value decoding circuit 180.

Figure 5:
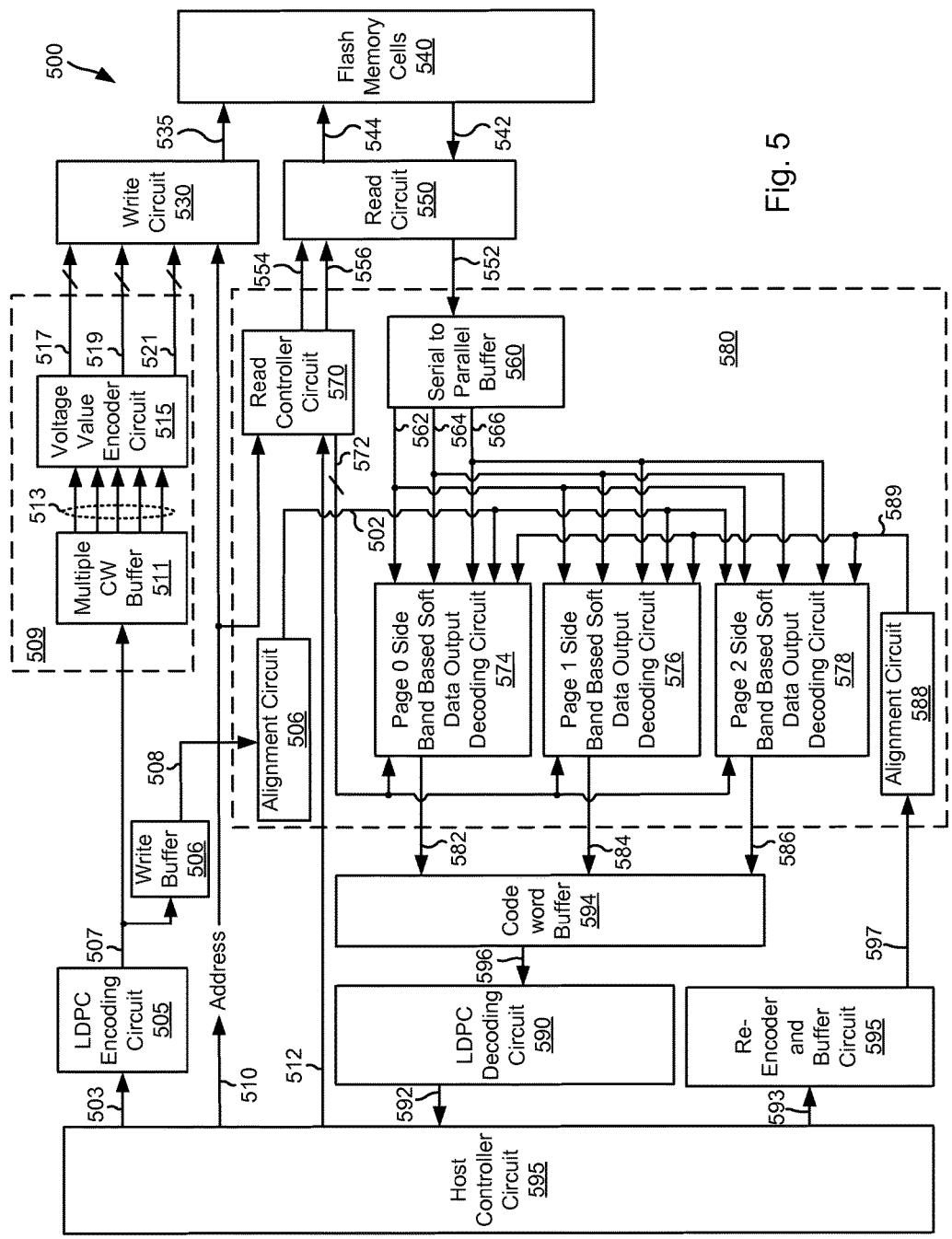
FIG. 5 shows a more detailed example of a solid state storage system including side data based soft data output voltage value decoding circuitry in accordance with some embodiments of the present invention.

Turning to FIG. 5, a solid state storage system 500 is shown that includes side data based soft data output voltage value decoding circuitry in accordance with some embodiments of the present invention. Solid state storage system 500 includes a host controller circuit 595, a low density parity check encoding circuit 505, a write buffer 506, a multi-level cell encoding circuit 509 shown in dashed lines, a write circuit 530, flash memory cells 540, a read circuit 550, a read controller and side data based soft data output voltage value decoding circuit 580 shown in dashed lines, a codeword buffer 594, and a low density parity check decoding circuit 590. Read controller and side data based soft data output voltage value decoding circuit 580 includes a read controller circuit 570, a serial to parallel buffer circuit 560, an alignment circuit 506, an alignment circuit 588, and three page soft data output decoding circuits 574, 576, 578. Multi-level cell encoding circuit 509 includes a multiple codeword buffer circuit 511 and a voltage value encoder circuit 515. Host controller circuit 595 directs read and write access to flash memory cells 540. Flash memory cells 540 may be NAND flash memory cells or another type of solid state memory cells as are known in the art.

A data write is effectuated when host controller circuit 595 provides input data 503 to low density parity check encoding circuit 505. Low density parity check encoding circuit 505 applies a low density parity check encoding algorithm to input data 503 to yield LDPC codewords 507. LDPC codewords 507 are stored to a write buffer 506 where they are maintained until overwritten. The stored LDPC codewords 508 are provided to read controller and soft data output voltage value decoding circuit 580 where if the data is still current it can be used as side data in relation to generating soft data.

In addition, LDPC codewords 507 are provided to voltage value encoding circuit 509. Voltage value encoding circuit 509 applies multi-level cell encoding to a group of LDPC codewords 507 to yield write data 505. In some embodiments of the present invention, five LDPC codewords are encoded together to yield write data 505 that is directed to flash memory cells 540 that are written as two-bit cells. It should be noted that while the various embodiments are discussed in relation to using a low density parity check encoding/decoding algorithm, that other encoding/decoding algorithms known in the art may be used in accordance with other embodiments of the present invention. Individual bits of each of the five stored codewords are selected and provided as a five bit word 513. This process is repeated for each bit position of the respective LDPC codewords resulting in a series of five bit words 513 being provided sequentially to voltage value encoder circuit 515 where the five bit words are encoded as three voltage values 517, 519, 521. Voltage value 517 corresponds to a voltage level that is to be written to a first of a three cell block of flash memory cells 540, voltage value 519 corresponds to a voltage level that is to be written to a second of the three cell block of flash memory cells 140, and voltage value 521 corresponds to a voltage level that is to be written to a third of the three cell block of flash memory cells 540. In some embodiments, voltage values 517, 519, 521 may be one of four voltage levels each representing a two-bit pattern stored in a given cell of flash memory cells 540. It should be noted that in other embodiments, eight or more voltage levels representing three or more bits stored in a given cell of flash memory cells 540 are possible in accordance with other embodiments of the present invention.

Turning to FIG. 2, an example of multi-level cell encoding 200 using multiple low density parity check codewords 201, 203, 205, 207, 209 to yield a series of five bit words that are encoded into write data in accordance with some embodiments of the present invention. Each of the low density parity check codewords 201, 203, 205, 207, 209 includes a number of bits indicated as positions (i.e., position 1, position 2, ... position n−1, and position n). It should be noted that an element (e.g., bit) of each of the respective codewords is found at each position. In some cases the element may be a filler value or an element from another codeword where a given codeword is shorter than another codeword. Thus, at position 1 a five bit word includes the first element of each of the five low density parity check codewords 201, 203, 205, 207, 209 (i.e., $\{A_1, B_1, C_1, D_1, E_1\}$). This is repeated for each of the positions 1 through n to yield n five bit words (i.e., $\{A_2, B_2, C_2, D_2, E_2\}$ ... $\{A_n, B_n, C_n, D_n, E_n\}$).

Returning to FIG. 5, voltage value encoder circuit 515 encodes each of the n five bit words 513 to a corresponding three value output that is provided as voltage values 517, 519, 521 to write circuit 530. Turning to FIG. 3, a five bit word 301a, 301b ($\{A, B, C, D, E\}$) to three voltage levels 303a, 303b ($\{X, Y, Z\}$) conversion table 300 is shown in accordance with some embodiments of the present invention. As shown, five bit word 301a, 301b correspond to the five bit words ($\{A, B, C, D, E\}$) discussed above in relation to FIG. 2. Thus, for example, where the five bit word is '00000' the corresponding three voltage levels ({X, Y, Z}) are "0, 2, 2". Similarly, where three voltage levels are "3, 1, 2" the corresponding five bit word is '10111'. Turning to FIG. 4a, another five bit word 401a, 401b ({A, B, C, D, E}) to three voltage levels 403a, 403b ({X, Y, Z}) conversion table 400 in accordance with some embodiments of the present invention. As shown, five bit word 401a, 401b correspond to the five bit words ({A, B, C, D, E}) discussed above in relation to FIG. 2. Thus, for example, where the five bit word is '00000' the corresponding three voltage levels ({X, Y, Z}) are "2, 2, 0". Similarly, where three voltage levels are "3, 1, 2" the corresponding five bit word is '10101'. It should be noted that while the aforementioned conversion tables are from five bit words to three voltage levels, other conversions may be possible in accordance with various embodiments of the present invention. For example, other embodiments of the present invention may use conversion tables from four bit words to three voltage levels. Based upon the disclosure provided herein, one of ordinary skill in the art will recognize other conversion tables that may be used in accordance with various embodiments of the present invention.

Returning to FIG. 5, write circuit 530 additionally receives an address 510 from host controller circuit 595. Write circuit 530 converts voltage values 517, 519, 521 (e.g., {X, Y, Z}) into a series of voltages 535 that are written to three cells of flash memory cells 540 indicated by address 510. Thus, for example, in the case where each cell of flash memory cells 540 are written as two bit cells, a voltage level of "0" (i.e., for a value of X, Y or Z equal to zero) results in voltage 535 being set below a lower threshold ($V_L$), a voltage level of "1" (i.e., for a value of X, Y or Z equal to one) results in voltage 535 being set above the lower threshold ($V_L$) and below a center threshold ($V_C$), a voltage level of "2" (i.e., for a value of X, Y or Z equal to two) results in voltage 535 being set above the center threshold ($V_C$) and below an upper threshold ($V_U$), and a voltage level of "3" (i.e., for a value of X, Y or Z equal to three) results in voltage 535 being set above the upper threshold ($V_U$). This process results in storing three voltage values respectively to three cells within flash memory cells to represent a five bit word. This process is repeated for each of the five bit words resulting in a group of multiple sets of three flash memory cells representing the five LDPC codewords received as LDPC codewords 507.

A data read is effectuated when host controller circuit 595 provides a read request indication 512 and address 510 to read controller circuit 570 of read controller and side data based soft data output voltage value decoding circuit 580. Read controller circuit 570 translates read request 512 and address 510 into an address 554 and a threshold value 556 (or series of threshold values) that are provided to read circuit 550. A read location 544 is generated by read circuit 550 based upon address 554 and provided to flash memory cells 540. In response, flash memory cells 540 provides return voltages 542 stored at the cells indicated by read location 544. Read circuit 550 compares return voltages 542 with threshold 556 to yield corresponding binary values 552.

Binary values 552 are provided to serial to parallel buffer 560 that assembles the binary values into sets of three bits 562, 564, 566 associated with the same five bit words. Bits 562, 564, 566 are provided to each of page 0 side band based soft data output decoding circuit 574, page 1 side band based soft data output decoding circuit 576, and page 2 side band based soft data output decoding circuit 578. Based upon the ongoing read, read controller circuit 570 asserts various enables 572 that enable operation of respective ones of page 0 side band based soft data output decoding circuit 574, page 1 side band based soft data output decoding circuit 576, and page 2 side band based soft data output decoding circuit 578. In particular, when soft data corresponding to all of the codewords associated with the five bit words is to be generated, read controller circuit 570 sequentially provides: the lower threshold ($V_L$) to obtain the soft data corresponding to the first LDPC codeword represented in the five bit words, the center threshold ($V_C$) to obtain the soft data corresponding to the second and third LDPC codewords represented in the five bit words, and the upper threshold ($V_U$) to obtain the soft data corresponding to the fourth and fifth LDPC codewords represented in the five bit words as threshold value 556. In addition, alignment circuit 506 aligns elements of stored LDPC codewords 508 with corresponding sets of three bits 562, 564, 566 to yield an aligned data value 502 where a codeword corresponding to the ongoing read remains in write buffer 506; and alignment circuit 588 aligns elements of re-encoded side data 597 with corresponding sets of three bits 562, 564, 566 to yield an aligned data value 588 where a codeword corresponding to the ongoing read remains has been decoded and remains in a buffer (not shown) holding read data in host controller 595.

Where soft data corresponding to only specific ones of the LDPC codewords represented in the five bit words is to be generated, some subset of the lower threshold ($V_L$), the center threshold ($V_C$), and/or the upper threshold ($V_U$) are sequentially presented as threshold value 556. For example, where soft data for only the third and fourth LDPC codewords is to be generated, the center threshold ($V_C$), and/or the upper threshold ($V_U$) are sequentially presented as threshold value 556. As another example, where soft data for only the fifth LDPC codeword is to be generated, only the upper threshold ($V_U$) is presented.

When the upper threshold ($V_U$) is presented as threshold value 556, enables 572 are asserted by read controller circuit 570 such that operation of page 2 side band based soft data output decoding circuit 578 is enabled, while operation of page 0 side band based soft data output decoding circuit 574 and page 1 side band based soft data output decoding circuit 576 is disabled. Alternatively, when the center threshold ($V_C$) is presented as threshold value 556, enables 572 are asserted by read controller circuit 570 such that operation of page 1 side band based soft data output decoding circuit 576 is enabled, while operation of page 0 side band based soft data output decoding circuit 574 and page 2 side band based soft data output decoding circuit 578 is disabled. As the other alternative, when the lower threshold ($V_L$) is presented as threshold value 556, enables 572 are asserted by read controller circuit 570 such that operation of page 0 side band based soft data output decoding circuit 574 is enabled, while operation of page 1 side band based soft data output decoding circuit 576 and page 2 side band based soft data output decoding circuit 578 is disabled.

When enabled, page 0 side band based soft data output decoding circuit 574 generates soft data corresponding to the first LDPC codeword represented in the five bit words based upon bits 562, 564, 566 corresponding to the result of comparing return voltages 542 with the lower threshold ($V_L$) and, where available, side band data provided as either aligned data value 502 or aligned data value 588. The generated soft data corresponding to the first LDPC codeword is provided as a soft data output 582 to codeword buffer 594. Similarly, when enabled, page 1 side band based soft data output decoding circuit 576 generates soft data corresponding to the second and third LDPC codewords represented in the five bit words based upon bits 562, 564, 566 corresponding to the result of comparing return voltages 542 with the center threshold ($V_C$) and where available, side band data provided as either aligned data value 502 or aligned data value 588. The generated soft data corresponding to the second and third LDPC codewords is provided as a soft data output 584 to codeword buffer 594. Similarly, when enabled, page 2 side band based soft data output decoding circuit 578 generates soft data corresponding to the fourth and fifth LDPC codewords represented in the five bit words based upon bits 562, 564, 566 corresponding to the result of comparing return voltages 542 with the upper threshold ($V_U$) and, where available, side band data provided as either aligned data value 502 or aligned data value 588. The generated soft data corresponding to the fourth and fifth LDPC codewords is provided as a soft data output 586 to codeword buffer 594.

Turning to FIG. 4b, a first part of the aforementioned process of comparing return voltages 542 with threshold 556 is shown where the conversion of FIG. 4a was used in the original encoding. This first part recovers a soft data representation of the first LDPC codeword (i.e., low density parity check codeword 201) based upon a combination of return voltages 542 and a side data value 414a, 414b. As shown, a table 410 represents conversion of the three voltage levels 403a, 403b ({X, Y, Z}) of FIG. 4a along with a side data value 414a, 414b where threshold 556 is the lower threshold ($V_L$). By comparing with $V_L$, any voltage value received as return voltages 542 that is less than $V_L$ (e.g., the voltage level of "0" discussed above) results in a binary '0', while any voltage value received as return voltages 542 that is greater than or equal to $V_L$ (e.g., the voltage levels of "1", "2" or "3" discussed above) results in a binary '1'. Thus, for example, where three cells of flash memory cells 540 return three voltage levels of "2, 2, 0", respectively, the corresponding binary output (i.e., binary values 552) is '110' (shown as values 413a, 413b). As another example, where three cells of flash memory cells 540 return three voltage levels of "3, 5, 2", respectively, the corresponding binary output is '111' (shown as values 413a, 413b). These binary values are added to side data ($S_1$ or $S_0$) where available, and the combination is mapped to a single soft data value corresponding to one LDPC codeword (i.e., low density parity check codeword 201). Said another way, the three bit binary values 413a, 413b along with the corresponding side data 414a, 414b map to soft data for a corresponding five bit word (i.e., SD for XXXX 411a, 411b).

Side data 414a, 414b is accessed from codeword buffer 594 or write buffer 506. In particular, where the flash memory cells have been accessed using the center threshold ($V_C$) resulting in recovery of low density parity check codeword 203 and low density parity check codeword 205, side data 414a, 414b may be a corresponding element from the recovered low density parity check codeword 203 which is adjacent to low density parity check codeword 201 being recovered using the lower threshold ($V_L$). Alternatively, where low density parity check codeword 203 remains in write buffer 506, the corresponding element from write buffer 506 can be accessed and used as side data 414a, 414b. Any corresponding element from an available one of a codeword that is in decoded form may be used as side data 414a, 414b. It should also be noted that while the embodiment is disclosed as using only one side data in addition to three bit binary values 413a, 413b, that other embodiments having access to multiple side bits may use those multiple side bits in addition to three bit binary values 413a, 413b to generate corresponding soft data. Thus, for example, where a corresponding element from low density parity check codeword 203 and a corresponding element from low density parity check 205 exist, both of the corresponding elements may be used in addition to three bit binary values 413a, 413b to generate the soft data value.

The conversion process from three bit binary values 413a, 413b and side data 414a, 414b to the single soft data value corresponding to one LDPC codeword (i.e., low density parity check codeword 201) may be done using a look up table that is loaded with pre-calculated soft data values corresponding to the combination of respective three bit binary values and side data. Alternatively, the soft data values corresponding to the respective three bit binary values and side data may be calculated on the fly based upon the respective three bit binary values. Comparison of the next set of three cells of flash memory cells with $V_L$ is performed to yield the soft data value corresponding to the next bit of the LDPC codeword (i.e., low density parity check codeword 201). This process is repeated until soft data values corresponding to all bits of the LDPC codeword are generated (i.e., low density parity check codeword 201). Where no side information is available, the soft data generated corresponds only to the three bit binary values 413a, 413b.

In some embodiments, the soft data values for any bit of a five bit word corresponding to only the respective three bit binary values 413a, 413b are calculated (either pre-calculated and stored to a look-up table, or calculated on the fly using a calculation circuit) in accordance with the following equation:

$$\text{Soft Data Value} = LLR(Y, p)$$
$$= \ln\left(\frac{\text{Probability}[b_p = 0 \mid Y]}{\text{Probability}[b_p = 1 \mid Y]}\right),$$

where LLR is a log-likelihood ratio, Y represents the three bit value 413a, 413b derived from flash memory cells 540, p represents the position in the five bit word, and $b_p$ represents the binary value for the bit at position p. The aforementioned equation is derived based upon the following:

$$\text{Probability}(b_p, Y) = \sum_{[b_i : i \neq p]} \text{Probability}(C(b_0, b_i, \ldots, b_{Np-1}) \mid Y),$$

where C are the three voltages provided from flash memory cells; where:

$$\text{Probability}(C, Y) = \frac{\text{Probability}(Y \mid C)}{\sum_{C'} \text{Probability}(Y \mid C')},$$

where $$\text{Probability}(Y, C) = \text{Probability}(Y \mid l(C))$$
$$= \prod_{i=0}^{L-1} \text{Probability}(y_i \mid l(c_i))$$

for the case of additive white Gaussian noise:

$$\text{Probability}(y = 0 \mid l) = \frac{1}{2}\left[1 + \text{erf}\left(\frac{t-1}{\sqrt{2\sigma^2}}\right)\right].$$

In various cases, quantized inputs are used in place of the three bit binary values. In such a case, the soft data output corresponding to the quantized inputs is calculated in accordance with the following equation:

$$\text{Soft Data Value} = LLR(U, p)$$
$$= \ln\left(\frac{\text{Probability}[b_p = 0 \mid U]}{\text{Probability}[b_p = 1 \mid U]}\right),$$

where U represents a quantized version of the three bit value 413*a*, 413*b* derived from flash memory cells 540.

The soft data values for any bit of a five bit word corresponding to a combination of the respective three bit binary values 413*a*, 413*b* and associated side data value 414*a*, 414*b* are calculated (either pre-calculated and stored to a look-up table, or calculated on the fly using a calculation circuit) in accordance with the following equation:

$$\text{Soft Data Value} = LLR(Y, B_s, p)$$
$$= \ln\left(\frac{\text{Probability}[b_p = 0, B \mid Y]}{\text{Probability}[b_p = 1, B \mid Y]}\right),$$

where LLR is a log-likelihood ratio, Y represents the three bit value 413*a*, 413*b* derived from flash memory cells 540, $B_s$ represents the side data value 414*a*, 414*b*, p represents the position in the five bit word, and $b_p$ represents the binary value for the bit at position p. The aforementioned equation is derived based upon the following:

$$\text{Probability}(b_p, B_s \mid Y) = \sum_{\{b_i : i \neq p, i \notin P_s\}} \text{Probability}(C(b_0, b_i, \ldots, b_{N_p-1}) \mid Y),$$

where C are the three voltages provided from flash memory cells, and $P_s$ is the grouping of all known side data values 414*a*, 414*b*; where:

$$\text{Probability}(C, Y) = \frac{\text{Probability}(Y \mid C)}{\sum_{C'} \text{Probability}(Y \mid C')},$$

where $$\text{Probability}(Y, C) = \text{Probability}(Y \mid l(C))$$
$$= \prod_{i=0}^{L-1} \text{Probability}(y_i \mid l(c_i))$$

for the case of additive white Gaussian noise:

$$\text{Probability}(y = 0 \mid l) = \frac{1}{2}\left[1 + \text{erf}\left(\frac{t-1}{\sqrt{2\sigma^2}}\right)\right].$$

In various cases, quantized inputs are used in place of the three bit binary values. In such a case, the soft data output corresponding to the quantized inputs is calculated in accordance with the following equation:

$$\text{Soft Data Value} = LLR(U, B_s, p)$$
$$= \ln\left(\frac{\sum_{\{b_i : i \neq p, i \notin P_s\}} \text{Probability}\left(C\begin{pmatrix} b_0, b_i, \ldots, b_p = \\ 0, \ldots, b_{N_p-1} \end{pmatrix} \Big| Y\right)}{\sum_{\{b_i : i \neq p, i \notin P_s\}} \text{Probability}\left(C\begin{pmatrix} b_0, b_i, \ldots, b_p = \\ 1, \ldots, b_{N_p-1} \end{pmatrix} \Big| Y\right)}\right),$$

where U represents a quantized version of the three bit value 413*a*, 413*b* derived from flash memory cells 540.

Turning to FIG. 4*c*, a second part of the aforementioned process of comparing return voltages 542 with threshold 556 is shown where the conversion of FIG. 4*a* was used in the original encoding. This second part recovers the second and third LDPC codewords (i.e., low density parity check codeword 203 and low density parity check codeword 205) based upon a combination of return voltages 542 and a side data value 414*a*, 414*b*. As shown, a table 430 represents conversion of the three voltage levels 403*a*, 403*b* ({X, Y, Z}) of FIG. 4*a* along with a side data value 434*a*, 434*b* where threshold 556 is the center threshold ($V_C$). By comparing with $V_C$, any voltage value received as return voltages 542 that is less than $V_C$ (e.g., the voltage levels of "0" or "1" discussed above) results in a binary '0', while any voltage value received as return voltages 542 that is greater than or equal to $V_C$ (e.g., the voltage levels of "2" or "3" discussed above) results in a binary '1'. Thus, for example, where three cells of flash memory cells 540 return three voltage levels of "2, 2, 0", respectively, the corresponding binary output (i.e., binary values 552) is '110' (shown as values 433*a*, 433*b*). As another example, where three cells of flash memory cells 540 return three voltage levels of "3, 5, 2", respectively, the corresponding binary output is '101' (shown as values 433*a*, 433*b*). These binary values are added to side data ($S_1$ or $S_0$) where available, and the combination is mapped to two soft data values corresponding to two LDPC codewords (i.e., low density parity check codeword 203 and low density parity check codeword 205). Said another way, the three bit binary values 433*a*, 433*b* along with the corresponding side data 434*a*, 434*b* map to soft data for a corresponding five bit word (i.e., SD for XXXX 411*a*, 411*b*).

Side data 434*a*, 434*b* is accessed from codeword buffer 594 or write buffer 506. In particular, where the flash memory cells have been accessed using the lower threshold ($V_L$) resulting in recovery of low density parity check codeword 201, side data 434*a*, 434*b* may be a corresponding element from the recovered low density parity check codeword 201 which is adjacent to low density parity check codeword 203 being recovered using the center threshold ($V_C$). Alternatively, where low density parity check codeword 201 remains in write buffer 506, the corresponding element from write buffer 506 can be accessed and used as side data 434*a*, 434*b*. Any corresponding element from an available one of a codeword that is in decoded form may be used as side data 434a, 434b. It should also be noted that while the embodiment is disclosed as using only one side data in addition to three bit binary values 433a, 433b, that other embodiments having access to multiple side bits may use those multiple side bits in addition to three bit binary values 433a, 433b to generate corresponding soft data. Thus, for example, where a corresponding element from low density parity check codeword 207 and a corresponding element from low density parity check 209 exist, both of the corresponding elements may be used in addition to three bit binary values 433a, 433b to generate the soft data value.

The conversion process from three bit binary values 433a, 433b and side data 434a, 434b to the two soft data values corresponding to respective LDPC codewords (i.e., low density parity check codeword 203, and low density parity check codeword 205) may be done using a look up table that is loaded with pre-calculated soft data values corresponding to the combination of respective three bit binary values and side data. Alternatively, the soft data values corresponding to the respective three bit binary values and side data may be calculated on the fly based upon the respective three bit binary values. Comparison of the next set of three cells of flash memory cells with $V_C$ is performed to yield the soft data value corresponding to the next bit of the LDPC codewords (i.e., low density parity check codeword 203, and low density parity check codeword 205). This process is repeated until soft data values corresponding to all bits of the LDPC codewords are generated (i.e., i.e., low density parity check codeword 203, and low density parity check codeword 205). Where no side information is available, the soft data generated corresponds only to the three bit binary values 433a, 433b. The conversion may be done in accordance with the equations discussed above in relation to FIG. 4b.

Turning to FIG. 4d, a third part of the aforementioned process of comparing return voltages 542 with threshold 556 is shown where the conversion of FIG. 4a was used in the original encoding. This third part recovers the fourth and fifth LDPC codewords (i.e., low density parity check codeword 207 and low density parity check codeword 209). As shown, a table 430 represents conversion of the three voltage levels 403a, 403b ({X, Y, Z}) of FIG. 4a where threshold 556 is the upper threshold ($V_U$). By comparing with $V_U$, any voltage value received as return voltages 542 that is less than $V_U$ (e.g., the voltage levels of "0" or "1" discussed above) results in a binary '0', while any voltage value received as return voltages 542 that is greater than or equal to $V_U$ (e.g., the voltage levels of "2" or "3" discussed above) results in a binary '1'. Thus, for example, where three cells of flash memory cells 540 return three voltage levels of "2, 2, 0", respectively, the corresponding binary output (i.e., binary values 552) is '110' (shown as values 453a, 453b). As another example, where three cells of flash memory cells 540 return three voltage levels of "3, 5, 2", respectively, the corresponding binary output is '101' (shown as values 453a, 453b). These binary values are added to side data ($S_1$ or $S_0$) where available, and the combination is mapped to two soft data values corresponding to two LDPC codewords (i.e., low density parity check codeword 207 and low density parity check codeword 209). Said another way, the three bit binary values 453a, 453b along with the corresponding side data 454a, 454b map to soft data for a corresponding five bit word (i.e., SD for XXXX 411a, 411b).

Side data 454a, 454b is accessed from codeword buffer 594 or write buffer 506. In particular, where the flash memory cells have been accessed using the center threshold ($V_C$) resulting in recovery of low density parity check codeword 203 and low density parity check codeword 205, side data 454a, 454b may be a corresponding element from the recovered low density parity check codeword 205 which is adjacent to low density parity check codeword 207 being recovered using the upper threshold ($V_U$). Alternatively, where low density parity check codeword 205 remains in write buffer 506, the corresponding element from write buffer 506 can be accessed and used as side data 454a, 454b. Any corresponding element from an available one of a codeword that is in decoded form may be used as side data 454a, 454b. It should also be noted that while the embodiment is disclosed as using only one side data in addition to three bit binary values 453a, 453b, that other embodiments having access to multiple side bits may use those multiple side bits in addition to three bit binary values 453a, 453b to generate corresponding soft data. Thus, for example, where a corresponding element from low density parity check codeword 203 and a corresponding element from low density parity check 205 exist, both of the corresponding elements may be used in addition to three bit binary values 453a, 453b to generate the soft data value.

The conversion process from three bit binary values 453a, 453b and side data 454a, 454b to the two soft data values corresponding to respective LDPC codewords (i.e., low density parity check codeword 207, and low density parity check codeword 209) may be done using a look up table that is loaded with pre-calculated soft data values corresponding to the combination of respective three bit binary values and side data. Alternatively, the soft data values corresponding to the respective three bit binary values and side data may be calculated on the fly based upon the respective three bit binary values. Comparison of the next set of three cells of flash memory cells with $V_C$ is performed to yield the soft data value corresponding to the next bit of the LDPC codewords (i.e., low density parity check codeword 207, and low density parity check codeword 209). This process is repeated until soft data values corresponding to all bits of the LDPC codewords are generated (i.e., i.e., low density parity check codeword 207, and low density parity check codeword 209). Where no side information is available, the soft data generated corresponds only to the three bit binary values 453a, 453b. The conversion may be done in accordance with the equations discussed above in relation to FIG. 4b.

Low density parity check decoding circuit 590 applies a low density parity check decoding algorithm to the resulting soft data values accessed as soft data 596 from codeword buffer 594 to yield recovered read data 592 that is provided to host controller circuit 595. Where page 0 side band based soft data output decoding circuit 574, page 1 side band based soft data output decoding circuit 576, and page 2 side band based soft data output decoding circuit 578 are implemented as look-up tables, three look-up tables are used—one for each of page 0, page 1 and page 2. Host controller 195 stores the read data 592 to a data buffer (not shown). Where read data 592 corresponds to decoding data (i.e., is side data), it is provided as feedback data 593 to a re-encoder and buffer circuit 595. Re-encoder and buffer circuit 595 applies the same LDPC encoding algorithm applied by LDPC encoding circuit 505, and the resulting encoded data is buffered. The buffered data is then provided as re-encoded side data 597 to read controller and side data based soft data output voltage value decoding circuit 580.

Figure 6:
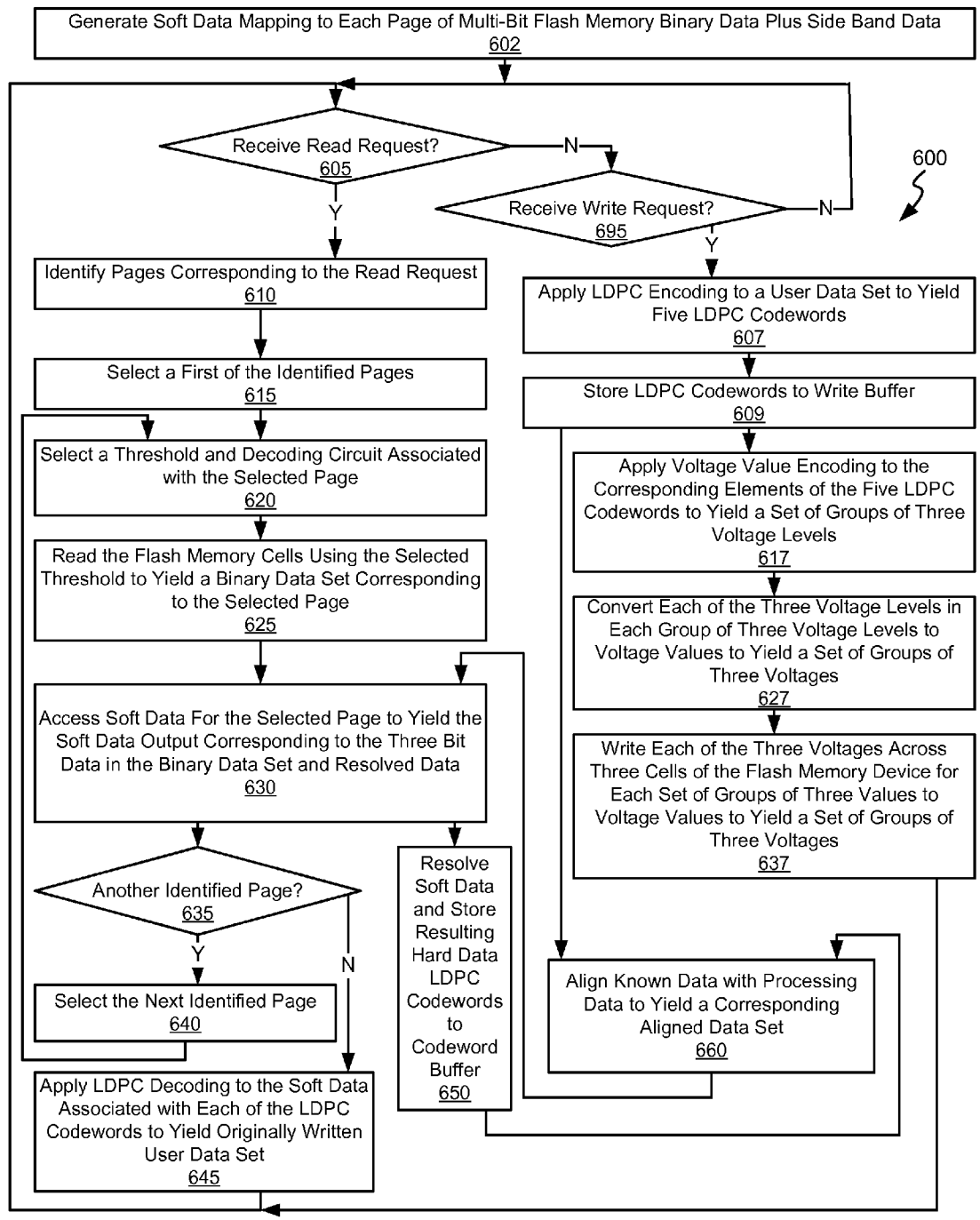
FIG. 6 shows a method in accordance with various embodiments of the present invention for side data based soft data based flash memory access.

Turning to FIG. 6, a flow diagram 600 shows a method in accordance with various embodiments of the present invention for efficient storage and access to/from flash memory cells. Following flow diagram 600, a soft data mapping to each page of a multi-bit flash memory binary data plus side band data is generated (block 602). This is generated by calculating the various soft data values, and storing the soft data values to a look-up table where they can be accessed using a combination of the multi-bit flash memory binary data plus side band data is generated. Entries for the look-up tables are generated both for situations where only the multi-bit flash memory binary data is available, and where both the multi-bit flash memory binary data and the side band data is available. In some embodiments, the soft data values for any bit of a five bit word corresponding to only the respective three bit binary values are calculated (either pre-calculated and stored to a look-up table, or calculated on the fly using a calculation circuit) in accordance with the following equation:

$$\text{Soft Data Value} = LLR(Y, p)$$
$$= \ln\left(\frac{\text{Probability}[b_p = 0 \mid Y]}{\text{Probability}[b_p = 1 \mid Y]}\right),$$

where LLR is a log-likelihood ratio, Y represents the three bit value derived from flash memory cells, p represents the position in the five bit word, and $b_p$ represents the binary value for the bit at position p. In various embodiments, the soft data values for any bit of a five bit word corresponding to a combination of the respective three bit binary values and associated side data value are calculated (either pre-calculated and stored to a look-up table, or calculated on the fly using a calculation circuit) in accordance with the following equation:

$$\text{Soft Data Value} = LLR(Y, B_s, p)$$
$$= \ln\left(\frac{\text{Probability}[b_p = 0, B \mid Y]}{\text{Probability}[b_p = 1, B \mid Y]}\right).$$

where LLR is a log-likelihood ratio, Y represents the three bit value derived from flash memory cells, $B_s$ represents the side data value, p represents the position in the five bit word, and $b_p$ represents the binary value for the bit at position p.

It is determined whether a read request is received (block 605). Where a read request has not been received (block 605), it is determined whether a write request is received (block 695). Where a write request has been received (block 695), low density parity encoding is applied to a user data set received as part of the write request (block 607). Five of the LDPC codewords resulting from application of the low density parity encoding are combined, and voltage value encoding is applied to the corresponding elements of the five LDPC codewords to yield a set of groups of three voltage levels (block 617).

The aforementioned process includes grouping corresponding elements of the five LDPC codewords to yield groups of five bit words. Turning to FIG. 2, an example of multi-level cell encoding 200 using multiple low density parity check codewords 201, 203, 205, 207, 209 to yield a series of five bit words that are encoded into write data in accordance with some embodiments of the present invention. Each of the low density parity check codewords 201, 203, 205, 207, 209 includes a number of bits indicated as positions (i.e., position 1, position 2, . . . position n-1, and position n). Thus, at position 1 a five bit word includes the first element of each of the five low density parity check codewords 201, 203, 205, 207, 209 (i.e., {$A_1$, $B_1$, $C_1$, $D_1$, $E_1$}). This is repeated for each of the positions 1 through n to yield n five bit words (i.e., {$A_2$, $B_2$, $C_2$, $D_2$, $E_2$} . . . {$A_n$, $B_n$, $C_n$, $D_n$, $E_n$}).

Once the grouping process is done for each of the n five bit words, the five bit words are encoded to yield the corresponding three voltage levels. Turning to FIG. 3, a five bit word 301a, 301b ({A, B, C, D, E}) to/from three voltage levels 303a, 303b ({X, Y, Z}) conversion table 300 is shown in accordance with some embodiments of the present invention. As shown, five bit word 301a, 301b correspond to the five bit words ({A, B, C, D, E}) discussed above in relation to FIG. 2. Thus, for example, where the five bit word is '00000' the corresponding three voltage levels ({X, Y, Z}) are "0, 2, 2". Similarly, where three voltage levels are "3, 1, 2" the corresponding five bit word is '10111'. Turning to FIG. 4a, another five bit word 401a, 401b ({A, B, C, D, E}) to/from three voltage levels 403a, 403b ({X, Y, Z}) conversion table 400 in accordance with some embodiments of the present invention. As shown, five bit word 401a, 401b correspond to the five bit words ({A, B, C, D, E}) discussed above in relation to FIG. 2. Thus, for example, where the five bit word is '00000' the corresponding three voltage levels ({X, Y, Z}) are "2, 2, 0". Similarly, where three voltage levels are "3, 1, 2" the corresponding five bit word is '10101'. It should be noted that while the aforementioned conversion tables are from five bit words to three voltage levels, other conversions may be possible in accordance with various embodiments of the present invention. For example, other embodiments of the present invention may use conversion tables from four bit words to three voltage levels. Based upon the disclosure provided herein, one of ordinary skill in the art will recognize other conversion tables that may be used in accordance with various embodiments of the present invention.

Returning to FIG. 6, each of the three voltage levels for each of the groups of three voltage levels are converted to corresponding voltage values (block 627). As an example, in the case where each cell is written as a two bit cell, a voltage level of "0" (i.e., for a value of X, Y or Z equal to zero) results in a voltage value being set below a lower threshold ($V_L$), a voltage level of "1" (i.e., for a value of X, Y or Z equal to one) results in a voltage value being set above the lower threshold ($V_L$) and below a center threshold ($V_C$), a voltage level of "2" (i.e., for a value of X, Y or Z equal to two) results in a voltage value being set above the center threshold ($V_C$) and below an upper threshold ($V_U$), and a voltage level of "3" (i.e., for a value of X, Y or Z equal to three) results in voltage value being set above the upper threshold ($V_U$). These voltage values are then written to three cells of a flash memory device (block 637). This process results in storing three voltage values respectively to three cells within flash memory cells to represent a five bit word. This process is repeated for each of the five bit words resulting in a group of multiple sets of three flash memory cells representing the five LDPC codewords encoded from the originally received user data. Additionally, the LDPC codewords are stored to a write buffer (block 609). These stored codewords remain in the write buffer until they are overwritten during a subsequent write access to the flash memory cells.

Alternatively, where a read request is received (block 605), pages corresponding to the request are identified (block 610). For example, if only the first of the LDPC codewords encoded to yield the set of groups of three voltage levels in block 617 is to be read, then only page 0 is identified. Alternatively, if only or both of the second and third of the LDPC codewords encoded to yield the set of groups of three voltage levels in block 617 is to be read, then only page 1 is identified. As yet another alternative, if only or both of the fourth and fifth of the LDPC codewords encoded to yield the set of groups of three voltage levels in block 617 is to be read, then only page 2 is identified. As yet another alternative, if all of the LDPC codewords encoded to yield the set of groups of three voltage levels in block 617 are to be read, then all of pages 0, 1, 2 are identified. Other subsets of pages may also be identified depending upon which of the LDPC codewords encoded to yield the set of groups of three voltage levels in block 617 are to be read.

The first of the identified pages is selected (block 615). Thus, for example, if only one page is to be read, then that one page is selected. If more than one page is to be read, then one of the more than one pages is selected. A threshold corresponding to the selected page to be read is selected (block 620). Thus, for example, if page 0 is selected to be read then lower threshold ($V_L$) is selected. Alternatively, if page 1 is selected to be read then center threshold ($V_C$) is selected. Alternatively, if page 2 is selected to be read then upper threshold ($V_U$) is selected.

The flash memory cells corresponding to the read request (i.e., the set of groups of three cells storing the encoded series of five bit words) are read using the selected threshold to yield a binary data set corresponding to the selected page (block 625). Where the lower threshold ($V_L$) is used, the binary data set includes the first LDPC codeword (i.e., low density parity check codeword 201). Alternatively, where the center threshold ($V_C$) is used, the binary data set includes the second and third LDPC codewords (i.e., low density parity check codeword 203 and low density parity check codeword 205). Alternatively, where the upper threshold ($V_U$) is used, the binary data set includes the fourth and fifth LDPC codewords (i.e., low density parity check codeword 207 and low density parity check codeword 209). This read yields a series of groups of three binary values for each group of three flash memory cells that are read.

Soft data corresponding to the selected page is accessed to yield the soft data output corresponding to the three bit data in the binary data set (and where available side band data—either maintained in a write buffer or previously resolved in the decoding circuit) where the soft data indicates a likelihood that bits in a particular position in the five bit word are correct (block 630).

It is determined if another page remains to be processed as part of the read request (block 635). Where another page remains to be processed (block 635), the next identified page is selected (block 640) and the processes of blocks 620-630 are repeated for the next identified page. Otherwise, where no other identified pages remain to be processed (block 635), LDPC decoding is applied to the soft data values generated for each of the LDPC codewords to yield the originally written user data set (block 645).

In addition, soft data corresponding to the accessed codewords is resolved to hard data (i.e., the most likely hard data is used to replace the soft data), and the resulting hard data LDPC codewords are stored to a codeword buffer (block 650). Where data is available (either in the write buffer or the codeword buffer) that corresponds to the currently read data sets, the known data is aligned with the currently processing data to yield a corresponding aligned data set (block 660). The data in the aligned data set may be used as the side band data of block 630. Where no data is available that corresponds to the currently processing data, block 630 converts the received three bit data to soft data values without using any sideband data.

It should be noted that the various blocks discussed in the above application may be implemented in integrated circuits along with other functionality. Such integrated circuits may include all of the functions of a given block, system or circuit, or a subset of the block, system or circuit. Further, elements of the blocks, systems or circuits may be implemented across multiple integrated circuits. Such integrated circuits may be any type of integrated circuit known in the art including, but are not limited to, a monolithic integrated circuit, a flip chip integrated circuit, a multichip module integrated circuit, and/or a mixed signal integrated circuit. It should also be noted that various functions of the blocks, systems or circuits discussed herein may be implemented in either software or firmware. In some such cases, the entire system, block or circuit may be implemented using its software or firmware equivalent—albeit such a system entirely implemented in software or firmware would not be a circuit. In other cases, the one part of a given system, block or circuit may be implemented in software or firmware, while other parts are implemented in hardware.

In conclusion, the invention provides novel systems, devices, methods and arrangements for data processing. While detailed descriptions of one or more embodiments of the invention have been given above, various alternatives, modifications, and equivalents will be apparent to those skilled in the art without varying from the spirit of the invention. Therefore, the above description should not be taken as limiting the scope of the invention, which is defined by the appended claims.

What is claimed is:

1. A method, comprising:
   accessing a first set of memory cells having a series of voltages written to the first set of memory cells, each cell having a voltage value representing codewords stored to the cell;
   receiving the voltage value of the each cell;
   comparing the voltage value of the each cell to a first threshold to determine a first binary set of the each cell, the first binary set including a first group of binary values;
   comparing the voltage value of the each cell to a second threshold to determine a second binary set of the each cell, the second binary set including a second group of binary values and a third group of binary values;
   generating a soft data representation of the codewords using a combination of the second group of binary values and at least one side data value;
   decoding the soft data representation to obtain recovered read data; and
   storing the recovered read data.

2. The method of claim 1, further comprising applying a low density parity check encoding algorithm to a user data set to yield the codewords.

3. The method of claim 1, further comprising applying a second encoding algorithm to a combination of the codewords to yield the voltage values.

4. The method of claim 1, wherein the soft data representation comprises a first set of soft data values, a second set of soft data values, and a third set of soft data values, each generated by combining a respective one of the second group of binary values and a corresponding element of the side data values.

5. The method of claim 4, wherein the first set of soft data values corresponds to a first low density parity check codeword, the second set of soft data values corresponds to a second low density parity check codeword, and the third set of soft data values corresponds to a third low density parity check codeword.

6. The method of claim 4, further comprising generating the at least one side data value by resolving the first set of soft data values to yield corresponding hard data values.

7. The method of claim 4, wherein the side data set corresponds to at least one of the first group of binary values, the second group of binary values, and the third group of binary values.

8. The method of claim 7, further comprising comparing the voltage value of the each cell to a third threshold to determine a third binary set of the each cell.

9. The method of claim 8, further comprising generating, by using the first data decoding circuit, a fourth set of soft data values each corresponding to a combination of a respective one of the third group of binary values and a corresponding element of the side data values and a fifth set of soft data values each corresponding to a combination of a respective one of the third group of binary values and a corresponding element of the side data values.

10. The method of claim 4, further comprising decoding, by a second data decoding circuit, the first set of soft data values to yield a first decoded output, the second set of soft data values to yield a second decoded output, and the third set of soft data values to yield a third decoded output.

11. A system, comprising:
a first set of memory cells having a series of voltages written to the first set of memory cells, wherein each cell has a voltage value representing codewords stored to the cell;
a data read circuit operable to:
compare the voltage value of the each cell to a first threshold to determine a first binary set of the each cell, the first binary set including a first group of binary values;
compare the voltage value of the each cell to a second threshold to determine a second binary set of the each cell, the second binary set including a second group of binary values and a third group of binary values;
a storage buffer operable to store side data values;
a first data decoding circuit operable to generate a soft data representation of the codewords using a combination of the second group of binary values and at least some of the side data values; and
a second data decoding circuit operable to decode the soft data representation to obtain recovered read data.

12. The system of claim 11, wherein a low density parity check encoding algorithm is applied to a user data set to yield the codewords.

13. The system of claim 11, wherein a second encoding algorithm is applied to a combination of the codewords to yield the voltage values.

14. The system of claim 11, wherein the soft data representation comprises a first set of soft data values, a second set of soft data values, and a third set of soft data values, each generated by combining a respective one of the second group of binary values and a corresponding element of the side data values.

15. The system of claim 14, wherein the first set of soft data values corresponds to a first low density parity check codeword, the second set of soft data values corresponds to a second low density parity check codeword, and the third set of soft data values corresponds to a third low density parity check codeword.

16. The system of claim 14, further comprising generating the side data values by resolving the first set of soft data values to yield corresponding hard data values.

17. The system of claim 14, wherein the first data decoding circuit generates the first set of soft data values, the second set of soft data values, and the third set of soft data values.

18. The system of claim 17, further comprising comparing the voltage value of the each cell to a third threshold to determine a third binary set of the each cell.

19. The system of claim 18, further comprising generating, by using the first data decoding circuit, a fourth set of soft data values each corresponding to a combination of a respective one of the third group of binary values and a corresponding element of the side data values and a fifth set of soft data values each corresponding to a combination of a respective one of the third group of binary values and a corresponding element of the side data values.

20. The system of claim 14, wherein the second data decoding circuit decodes the first set of soft data values to yield a first decoded output, the second set of soft data values to yield a second decoded output, and the third set of soft data values to yield a third decoded output.

* * * * *